US008975715B2

(12) United States Patent
Kautzsch

(10) Patent No.: US 8,975,715 B2
(45) Date of Patent: Mar. 10, 2015

(54) PHOTODETECTOR AND METHOD FOR MANUFACTURING THE SAME

(75) Inventor: Thoralf Kautzsch, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 229 days.

(21) Appl. No.: 13/537,452

(22) Filed: Jun. 29, 2012

(65) Prior Publication Data

US 2013/0062502 A1 Mar. 14, 2013

Related U.S. Application Data

(63) Continuation-in-part of application No. 13/232,564, filed on Sep. 14, 2011.

(51) Int. Cl.
 H01L 31/0224 (2006.01)
 H01L 31/18 (2006.01)
 H01L 31/062 (2012.01)

(52) U.S. Cl.
 CPC ............... *H01L 31/062* (2013.01); *Y02E 10/50* (2013.01)
 USPC ...... 257/428; 257/48; 257/431; 257/E31.124; 257/E31.001

(58) Field of Classification Search
 CPC .................... H01L 31/02016; H01L 31/02
 USPC ................................ 257/233, 292, 431–466
 See application file for complete search history.

(56) References Cited

U.S. PATENT DOCUMENTS

| 2004/0201009 A1* | 10/2004 | Hsu et al. ................... 257/21 |
| 2005/0230722 A1* | 10/2005 | Najda ......................... 257/293 |
| 2007/0102740 A1 | 5/2007 | Ellis-Monaghan et al. |
| 2007/0141809 A1 | 6/2007 | Ponza et al. |

FOREIGN PATENT DOCUMENTS

| CN | 101385119 A | 3/2009 |
| WO | 2005078801 A1 | 8/2005 |
| WO | 2008129433 A2 | 10/2008 |

OTHER PUBLICATIONS

Notice of Allowance dated Jul. 24, 2014 in connection with U.S. Appl. No. 13/232,564.

* cited by examiner

*Primary Examiner* — Mamadou Diallo
(74) *Attorney, Agent, or Firm* — Eschweiler & Associates, LLC

(57) ABSTRACT

A photodetector includes a substrate and an insulating arrangement formed in the substrate. The insulating arrangement electrically insulates a confined region of the substrate. The confined region is configured to generate free charge carriers in response to an irradiation. The photodetector further includes a read-out electrode arrangement configured to provide a photocurrent formed by at least a portion of the free charge carriers that are generated in response to the irradiation. The photodetector also includes a biasing electrode arrangement that is electrically insulated against the confined region by means of the insulating arrangement. The biasing electrode arrangement is configured to cause an influence on a spatial charge carrier distribution within the confined region so that fewer of the free charge carriers recombine at boundaries of the confined region compared to an unbiased state.

21 Claims, 15 Drawing Sheets

PHOTODETECTOR AND METHOD FOR MANUFACTURING THE SAME

CROSS REFERENCE TO RELATED APPLICATIONS

This application is a continuation-in-part of application Ser. No. 13/232,564, filed Sep. 14, 2011.

FIELD

Embodiments of the present invention relate to a photodetector. Further embodiments of the present invention relates to a method for manufacturing a photodetector. Further embodiments relate to an array of photodetectors or photosensitive pixel elements. Moreover, some embodiments of the present invention relate to a photosensitive pixel element.

BACKGROUND

In many industrial and consumer applications there is a need to analyze optical data and pictures. There is a trend towards highly integrated photosensitive pixel arrays (camera elements) integrated in a CMOS circuit or ASIC.

These devices may be used, for example, in security applications, IT products and optical communication networks. There is a huge variety in specifications such as number of pixels, spectral response and speed. Another important property of a photodetector or a photosensitive device is the quantum efficiency (QE) which indicates the device's electrical sensitivity to light. Depending on the specific application or device different definitions for the quantum efficiency are used. Typically, the quantum efficiency is a function of the wavelength of the incident light and may be used as a performance measure for the photosensitive device at different wavelengths.

When several photosensitive pixel elements are arranged in an array, cross talk between two or more photosensitive pixel elements may be an issue.

In the context of what is disclosed in this document, a photodetector is a device capable of converting electromagnetic irradiation into an electrical quantity, such as voltage, current, resistance, etc. Typically, a wavelength of the electromagnetic irradiation is within a range that is visible to the human eye or adjacent to the visible wavelength range, such as infrared light or ultraviolet light. Nevertheless, it is also possible that a specific photodetector is configured to detect electromagnetic radiation in another wavelength range.

A single photodetector may be used for providing a single electrical signal indicating e.g. a brightness of an incident radiation. Another possible application of a photodetector is within image sensors, where a plurality of photodetectors are arranged in an array. Typically, a photodetector is responsive to a fixed or predetermined range of the wavelengths.

SUMMARY

Embodiments of the present invention provide a photodetector comprising a substrate, an insulating arrangement, a read-out electrode arrangement, and a biasing electrode arrangement. The insulating arrangement is formed in the substrate and is configured to electrically insulate a confined region of the substrate. The confined region is configured to generate free charge carriers in response to an irradiation. The read-out electrode arrangement comprises at least two electrodes contacting different portions of the confined region and is configured to provide a photocurrent formed by at least a portion of the free charge carriers that are generated in response to the irradiation. The biasing electrode arrangement is electrically insulated from the confined region by means of the insulating arrangement. The biasing electrode arrangement is configured to be electrically biased which causes an influence on a spatial charge carrier distribution within the confined region so that fewer of the free charge carriers recombine at boundaries of the confined region compared to an unbiased state.

Embodiments of the present invention provide a photodetector comprising a substrate, an insulating layer within the substrate, a trench arrangement, a read-out electrode arrangement, and a biasing electrode arrangement. The insulating layer is substantially parallel to a main surface of the substrate. The trench arrangement comprises at least one trench that extends from the main surface at least to a depth of the insulating layer so that the trench arrangement and the insulating layer delimit a confined region. The confined region is configured to generate free charge carriers in response to an irradiation. The read-out electrode arrangement comprises at least two electrodes contacting different portions of the confined region for conducting a photocurrent associated with at least a portion of the free charge carriers generated in response to the irradiation. The biasing electrode arrangement is formed within the trench arrangement. The biasing electrode arrangement is configured to be electrically biased and to thereby produce a surface charge at an interface between the confined region and the trench arrangement. The surface charge reduces a recombination activity at the interface.

Embodiments of the present invention provide a photodetector comprising a substrate, means for electrically insulating a confined region of the substrate, and means for providing a photocurrent as an output of the photodetector. The confined region is configured to generate free charge carriers in response to an irradiation. The photocurrent is formed by at least a portion of the free charge carriers that are generated in response to the irradiation. The photodetector further comprises means for influencing a spatial charge carrier distribution within the confined region so that in a biased state the means for influencing, fewer of the free charge carriers recombine at boundaries of the confined region compared to an unbiased state. The means for influencing are formed within the substrate and insulated against the confined region by means of the means for electrically insulating the confined region.

Embodiments of the present invention provide a method for manufacturing a photodetector. The method comprises: providing a semiconductor substrate having a main surface; forming an insulating arrangement within the substrate that electrically insulates a confined region of the substrate; forming a biasing electrode arrangement electrically insulated against the confined region by means of the insulating arrangement; and forming a read-out electrode arrangement. The read-out electrode arrangement comprises at least two electrodes contacting different portions of the confined region and is configured to provide a photocurrent formed by at least a portion of the free charge carriers that are generated in response to the irradiation.

Further embodiments provide a method for determining a spectral characteristic of an irradiation on a confined region of a semiconductor substrate, the confined regions being configured to generate free charge carriers in response to an irradiation. The method comprises: controlling a biasing electrode arrangement to be in a first operating state having a first influence on a spatial charge carrier distribution within the confined region, wherein the biasing electrode arrangement is electrically insulated against the confined region; and determining a first photosignal produced by the confined region in response to the irradiation while the biasing electrode arrangement is in the first operating state. The method further comprises controlling the biasing electrode arrangement to be in a second operating state having a second influence on a spatial charge carrier distribution within the confined region, wherein fewer of the free charge carriers recombine at boundaries of the confined region during the second operating state than during the first operating state; determining a second photosignal produced by the confined region in response to the irradiation while the biasing electrode arrangement is in the second operating state; and evaluating the first and second photosignals for achieving an information of the spectral characteristic of the irradiation in the confined region.

BRIEF DESCRIPTION OF THE FIGURES

Embodiments of the present invention will be described using the underlying figures, in which.

DETAILED DESCRIPTION

Before embodiments of the present invention will be described in the following in detail using the accompanying figures, it is to be pointed out that the same element or elements having the same functionality are provided with the same or similar reference numbers and that a repeated description of elements provided with the same or similar reference numbers is typically omitted. Descriptions provided for elements having the same or similar reference numbers are mutually exchangeable. In the following description, a plurality of details are set forth to provide a more thorough explanation of embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In other instances, well-known structures and devices are shown in schematic cross sectional views or top-views rather than in detail in order to avoid obscuring embodiments of the present invention. In addition, features of the different embodiments described herein may be combined with each other, unless specifically noted otherwise.

In the field of optoelectronics, improving the quantum efficiency of a photodetector or other photosensitive elements is among the major goals of the research in this area. However, when several photodetectors or photosensitive pixel elements are arranged in close vicinity to each other, for example in an array, a high degree of quantum efficiency may lead to increased cross talk between the individual photodetectors or pixel elements. This effect may become even more pronounced as the size of the individual pixel elements decreases for the sake of miniaturization. Even though the increased quantum efficiency may make it possible to shrink the individual pixel elements themselves, they may have to be spaced apart from each other with a certain minimal distance in order to keep the cross talk at an acceptable level. This cross talk-related interference is even more pronounced when using infrared light at relatively small or even tiny element sizes (e.g., 10 µm or smaller).

One possible measure against cross talk is to provide lifetime killers (recombination centers) below the pixel array. This procedure may suppress cross talk as long as the exciting photons generate excess charge carriers close to the junction (space charge region) of the device. When using infrared light, a penetration depth of more than 10 µm is to be handled. This limits the potential for further reduction of the natural dimensions of the individual pixels and/or the spacing between adjacent pixels (the deeper the charge carrier, the higher the chance that it diffuses to a pixel in the neighborhood).

Figure 1:
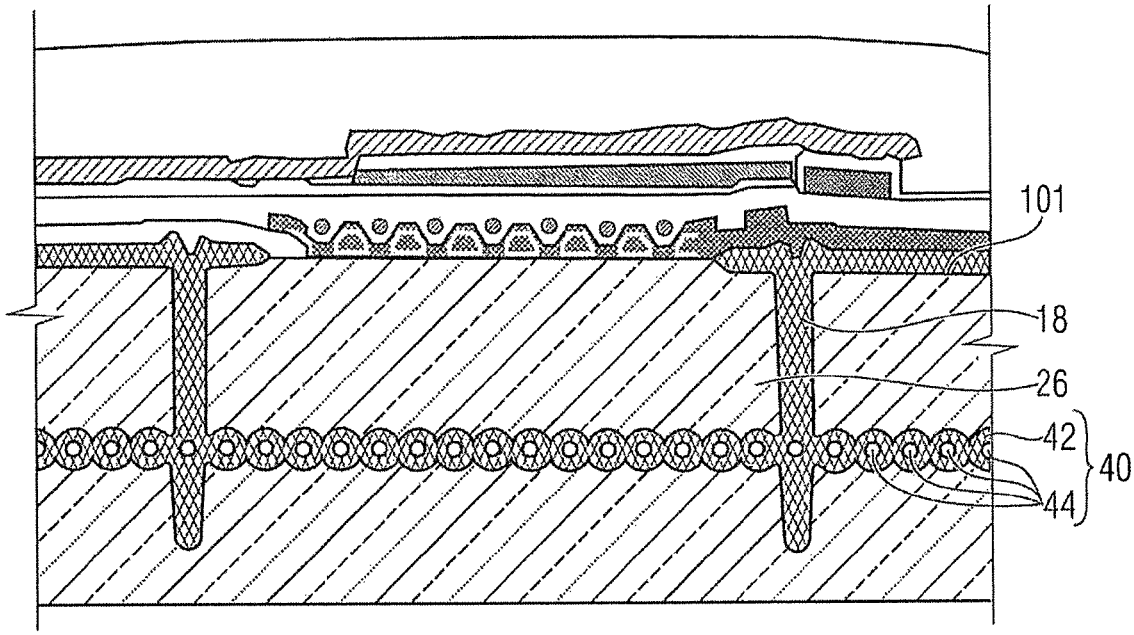
FIG. 1 shows a schematic cross section of a semiconductor device having a box shaped dielectric isolation for power electronics.

FIG. 1 shows a schematic cross section of an electronic device that may be used in power electronics, i.e., a different field than optoelectronics. In particular, FIG. 1 shows a structure that may be obtained by means of a process called "VENEZIA" or "Empty-Space-in-Silicon (ESS)". The "empty-space-in-silicon" process was conceived by Toshiba Corporation, while the "VENEZIA" process was almost concurrently conceived by STMicroelectronics. Both processes, although possibly different in detail, are similar. The "VENEZIA" process derives its name from similarities between the house building technique used in the city of Venice (basement on pileworks) and the process itself. SOI-VENEZIA substrates are obtained starting from normal silicon wafers by opening a series of trenches that are successively oxidized after epitaxial growth. The etching step can be either selected or extended to all those surface of the chip. The oxidized buried channels and cavities obtainable inside the monocrystalline silicon enable not only the manufacturing of low-cost SOI substrates, but also microfluidic applications and innovative low-cost piezo-resistive and capacitive pressure sensors.

In particular, FIG. 1 shows a plurality of buried channels 44 arranged in a layer 40 within the substrate, the layer 40 being parallel to a main surface 101 of the substrate. The layer 40 is at a certain depth from the main surface 101 within the substrate. The buried channels 44 are delimited by a structure of buried oxide 42. In particular, each buried channel 44 is delimited by a tube of buried oxide. Adjacent tubes contact each other so that a continuous layer of tubes of buried oxide, each enclosing one of the buried channels, is formed at least within a portion of the substrate.

In addition to the insulating layer formed by the buried oxide 42 arranged as a plurality of side-by-side tubes, the structure illustrated in FIG. 1 also comprises a trench isolation 18. In FIG. 1, two trenches are illustrated. The trenches extend from the main surface 101 of the substrate into the substrate and reach down to a depth that is greater than the depth of the insulating layer 40. However, it is also possible that the trenches 18 reach down to a depth that is approximately equal to the depth of the insulating layer 40. The trenches 18 are filled with oxide which merges with the buried oxide of the insulating layer 40. An SOI pocket 26 is delimited by the two trenches 18, the main surface 101 of the substrate, and the insulating layer 40. This provides a box shaped dielectric isolation, e.g., power electronics. Above the main surface of the substrate various micro-electromechanical (MEMS) and/or electronic structures are formed which do not need to be explained in detail in the context of the description of FIG. 1.

Figure 2:
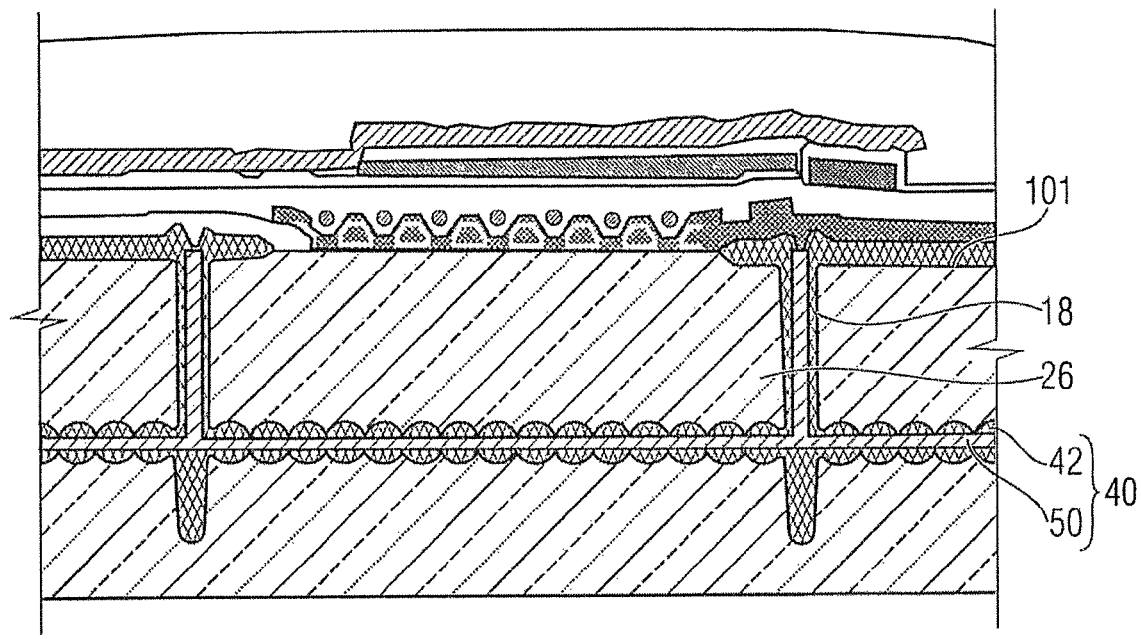
FIG. 2 shows a schematic cross section of a semiconductor device according to embodiments.

FIG. 2 shows a schematic cross section of a modification, according to embodiments, of the electronic device of FIG. 1. According to embodiments, a full dielectric isolation of each pixel element is combined with an active and possibly switchable electrode layer that alters the spectral response and quantum efficiency of the device. The first part—the dielectric isolation—may be produced by using a combination of the Venice process (i.e., the "VENEZIA" process) and a trench configuration, as illustrated in FIG. 1. This configuration is modified using an unclosed trench isolation, i.e., the trenches 18 are not completely filled with the insulating material but cavities remain within the trenches. The cavities of the unclosed trench isolation are filled with an electrode material 50. Such a combination is schematically shown in FIG. 2. The electrode material 50 is also present within the insulating layer 40. In the configuration schematically illustrated in FIG. 2 the electrode material 50 within the insulating layer 40 is electrically conductively connected with the electrode material 50 within the trenches 18.

The configuration shown in FIG. 2 exhibits, inter alia, the following two properties: by applying a voltage that causes accumulation of majority carriers at the boundary of active pixel boxes, the surface is (additionally) passivated and the internal quantum efficiency is strongly improved. The same holds for an inversion layer that may be formed at the boundary when using a voltage of opposite polarity. The latter is given when the inversion layer is part of a pn junction and contacted at the surface. In this case, electrons and holes from the bulk are separated at the space charge region adjacent to the inversion layer before they can recombine at the internal boundary.

The quantum efficiency (QE) of a photodetector, a photosensitive device, a solar cell, etc. may be defined as the ratio of the number of charge carriers collected by the device to the number of photons of a given energy shining on the device. Two types of quantum efficiency are often considered: external quantum efficiency (EQE) and internal quantum efficiency (IQE). The following definitions of internal and external quantum efficiencies are considered in the present description of embodiments. The external quantum efficiency (EQE) is the ratio of the number of charge carriers collected by the device to the number of photons (of a given energy) shining on the device (incident photons). The internal quantum efficiency (IQE) is the ratio of the number of charge carriers collected by the device to the number of photons (of a given energy) that are actually absorbed by the device. Note that a portion of the incident photons may traverse the device or may be reflected at the surface without being absorbed. Therefore, the IQE is at least as high as the EQE and typically higher than the EQE. A low IQE indicates that the device is unable to make good use of absorbed photons, i.e., a large portion of free charge carrier pairs generated by the absorbed photons cannot be exploited, for example, because they recombine before reaching the output electrodes of the device where the photogenerated charge carriers can be extracted as a photocurrent.

Three basic types of recombination can typically be distinguished in the bulk of a single-crystal semiconductor. These recombination types are: radiative recombination, Auger recombination, and Shockley-Read-Hall recombination. Any defects or impurities within or at the surface of the semiconductor promote recombination. Since the surface of the substrate represents a severe disruption of the crystal lattice, the surfaces of the substrate are a site of particularly high recombination. The high recombination rate in the vicinity of a surface depletes this region of minority charge carriers. As the free charge carriers within the substrate are typically subject to diffusion, which is a function of a spatial charge carrier distribution within the substrate, a localized region of low carrier concentration causes carriers to flow into this region from the surrounding, higher concentration regions. Therefore, the surface recombination rate is limited by the rate at which minority carriers move towards the surface. A parameter called the "surface recombination velocity", in units of cm/s, is used to specify the recombination at a surface. The defects at a semiconductor surface may be caused by the interruption of periodicity of the crystal lattice, which causes dangling bonds at the semiconductor surface. The reduction of the number of dangling bonds, and hence surface recombination, may be achieved by growing a layer on top of the semiconductor surface which ties up some of these dangling bonds. This reduction of dangling bonds is known as surface passivation.

In addition or as an alternative to the surface passivation by means of a passivation layer of a different material (e.g., an oxide or a nitride of the substrate material) at the surface of the semiconductor, the same effect may be achieved by providing a surface charge at the surface or the interface of the semiconductor. The reduction of recombination by means of a surface charge may be regarded as a field effect passivation. Moreover, it may be sufficient to apply a voltage between the two sides of the surface or of the boundary. The applied voltage between the two sides of the surface or the boundary may cause an electric field across the boundary and/or within the substrate (in particular within a confined region of the substrate delimited by the boundary).

As mentioned above, the passivation of a boundary of the substrate or a region of the substrate using a surface charge may take (at least) two forms. According to a first form of passivation, an accumulation of majority charge carriers occurs within and at the boundary of the confined region (e.g., of an active pixel box). This may be achieved by electrically biasing the substrate outside the confined region so that the majority charge carriers are attracted by the boundary. At the same time, the minority charge carriers may be repelled by the boundary so that they are prevented from recombining at the boundary. According to a second form of passivation, an accumulation of minority charge carriers occurs at the boundary of and within the confined region. A sufficiently high concentration of minority charge carriers within a thin layer at the boundary results in a situation in which there are no or not enough majority charge carriers available at the boundary for recombination. The thin layer at the boundary is called an inversion layer because the roles of minority charge carriers and majority charge carriers are inversed compared to the rest of the confined region. Additional minority charge carriers reaching the inversion layer are available as free charge carriers, turning the inversion layer into an electrically conductive region, or "channel" extending along the internal boundary or interface.

In the structure schematically illustrated in FIG. 2, the electrode material 50 may be electrically biased and thus influence a spatial charge carrier distribution within the confined region or SOI pocket 26. The electrode material 50 is electrically insulated against the SOI pocket due to the walls of the trench arrangement 18 and the buried oxide 42 of the insulating layer 40.

Figure 3:
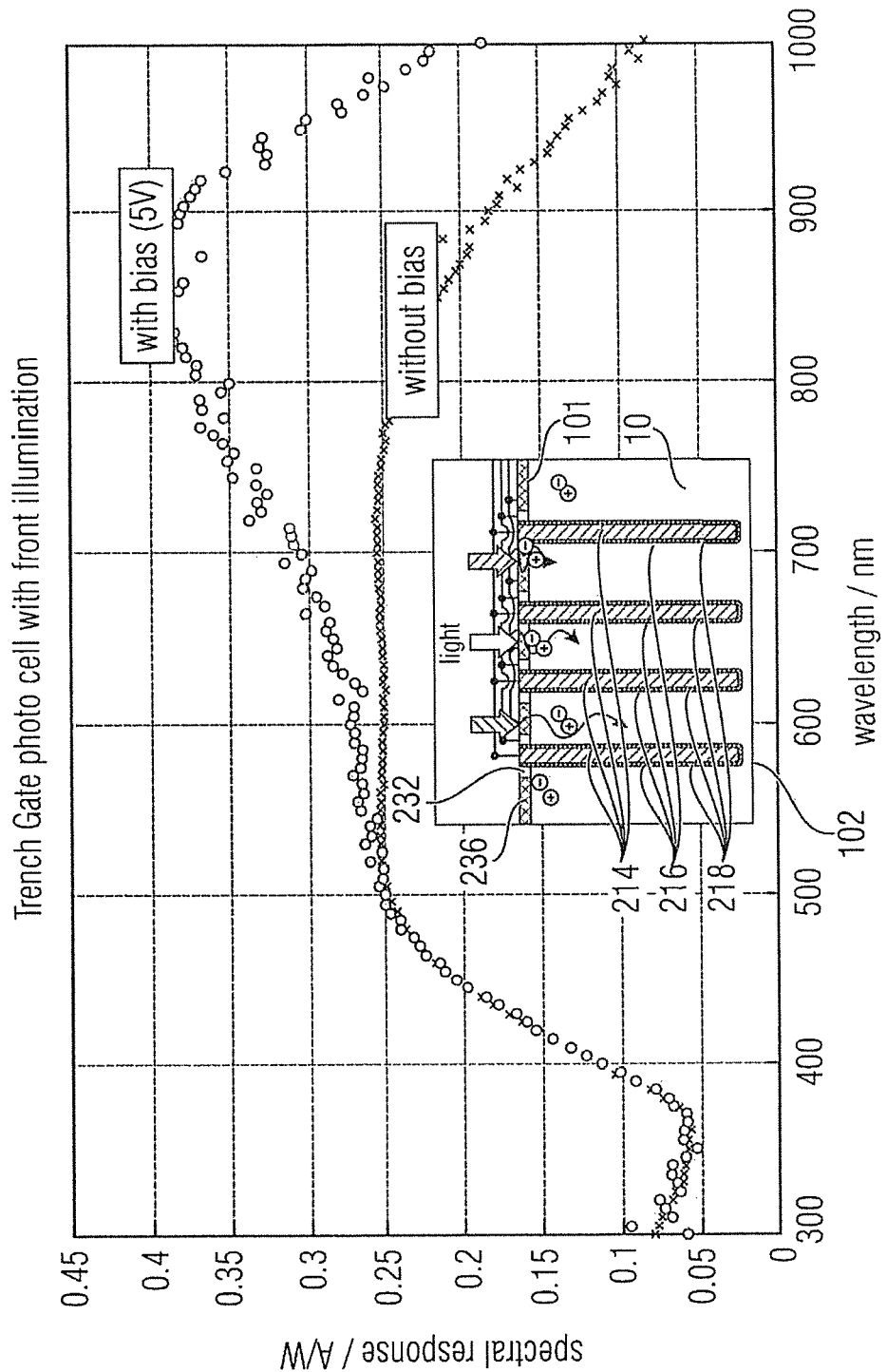
FIG. 3 shows a graph of the spectral response over wavelength for two different operating states of a metal-insulator-semiconductor (MIS) photocell device.

FIG. 3 shows a graph of a spectral response measurement of an MIS (metal-insulator-semiconductor) photocell device. An inset within FIG. 3 shows a schematic cross section of an MIS photocell. In the following, the functional principle of an MIS photocell is explained. To this end, let us first consider a simple arrangement of a photocell which includes a semiconductor having two differently doped regions, an n-doped region and a p-doped region. In the boundary region between both regions a depletion zone (or space charge zone) is formed in which stationary, charged dopant atoms represent the vast majority of electric charges. In the p-doped boundary region of, for example, a silicon semiconductor, negatively charged acceptors (for example, boron atoms) are present. In the adjacent n-region positively charged donors (e.g., phosphor atoms) are located. These charges cause an electric field which acts upon mobile charges (negative electrons and positive holes).

An electron/hole pair generated by light may be separated by such an electric field. A precondition for this is, however, that the charge carriers are either generated in the depletion zone (space charge zone) or may reach the same by diffusion, when a suitable concentration gradient of the charge carriers exists and the pair of particles is not destroyed (by recombination) again before reaching the depletion zone. From this, a photo voltage results which may lead to an exterior current flow when said regions are suitably contacted.

Equivalently, instead of an n-doped region, an inversion zone may be used. Here, by a suitable external potential (e.g., caused by a conductive plate insulated by an insulator, e.g. an oxide, from the semiconductor) the surface charge carrier concentration can be changed so that the electron concentration is higher than the hole concentration deep within the volume of the semiconductor. Thus, a depletion zone between the inversion zone and the deep volume is formed which is able to separate charge carrier pairs.

The photocurrent is thus a result of the cooperation of local fields (e.g., in depletion zones) and concentration gradients of mobile charges. The concentration gradients are defined by spatially varying generation and recombination processes and by transport processes.

The following example is presented to illustrate the cooperation between the local fields and the concentration gradients of mobile charges. At the surfaces of the semiconductor, unsaturated bindings (bonds) are present which cause an increased recombination of electrons and holes. In case of a charge carrier concentration which is above the equilibrium concentration, for example due to photo generation, mobile electrons and mobile holes are destroyed (i.e., they recombine) at the surfaces of the semiconductor. Hence, a concentration gradient is formed which causes charge carriers to diffuse from the interior of the semiconductor to the surface(s), so that these mobile charge carriers also recombine at the surface defects/impurities. These charge carriers subject to recombination at the surface(s) thus do not contribute to the photocurrent. Thus, also the depletion zone in the internal volume of the semiconductor, at the pn junction (or at the inversion zone in case of the MIS structure), creates a charge carrier drain for the minority charge carriers (in the p-semiconductor these are the electrons, in the n-semiconductor the holes), as the described field extracts the same into the opposing region (or into the inversion zone). These charge carriers may contribute to the photocurrent when collected in a suitable manner.

To be more specific, in case the charge carriers are transported via the inversion zone to an external contact and, then, to an external circuitry as a photocurrent, a charge carrier concentration at, or nearly at or near to, the equilibrium concentration is maintained in the material of the semiconductor substrate adjacent (at the border) to the depletion zone/inversion zone even during a photo generation of charge carriers in the semiconductor substrate. Thus, in response to a photo generation of charge carriers in the irradiation zone, a charge carrier concentration gradient is formed in the irradiation zone in a direction to the depletion zone (and the inversion zone adjacent thereto). This charge carrier concentration gradient effects a minority charge carrier diffusion to the depletion zone/inversion zone. Therefore the depletion zone acts as a charge carrier drain for the minority charge carriers photo generated in the irradiation zone.

The described processes are, in case of a photo generation (generation of electron/hole pairs by light), overlaid by a spatially varying generation process. On the one hand, a light beam which generates the same number of charge carrier pairs per wavelength unit causes an exponentially decaying irradiation strength in the semiconductor (evanescent light field). On the other hand, the absorption (generation) is dependent on the wavelength—blue light is absorbed substantially faster in silicon than red or infrared light. Thus, a locally varying concentration of charge carriers is caused only by the irradiation of the semiconductor. In particular the dependence of the absorption on the wavelength of the light may be used to enable a spectral evaluation of the light by an advantageous spatial setup of the photodetector.

In the inset of FIG. 3, a device is illustrated which, for example, comprises an n-doped semiconductor or a p-doped semiconductor, i.e. the semiconductor substrate 10. The inset in FIG. 3 shows a schematic cross section of an MIS structure for evaluating a radiation from the chip front side or main surface 101 (irradiation from the backside is also possible). Within the semiconductor substrate 10, so called deep trenches 218 are located, wherein the deep trenches 218 are provided with a thin dielectric 216 at the side faces and at the bottom. Within the trenches 218, the cavities left by the thin dielectric 216 are filled with a conductive electrode material 214. The thin dielectric 216 and the conductive electrode material 214 are part of a structure that may be called an inversion zone generator. When a suitable potential is applied to the electrode(s) 214, an inversion zone is formed (typically some nm wide) in the adjacent region of the semiconductor region. This arrangement is then able to separate electron/ hole pairs which were generated by incident light as exemplarily described above with respect to the MIS structure. Now, the charge carriers may superficially (i.e., at the first main surface 101 of the semiconductor substrate 10) contribute to an exterior photocurrent by contacting.

In the illustrated example of the inset in FIG. 3, the semiconductor substrate 10 is a p-doped semiconductor. In order to conduct charge carriers from the inversion zone to the outside, in the (immediate) surrounding of the trenches 218 a contact is set to a local n-region 232 in order to act as the contact zone mentioned above. Likewise, a substrate contact is set to a local p-region 236. The n-region 232 may be an n-SD-implant and the p-region 236 may be a p-SD-implant. Now, two cases of operation are possible. When the inversion zone is switched on, charge carriers from the depth of the semiconductor may contribute to the photocurrent which would not have reached the superficial p-n junction between the p-doped substrate 10 and the contact zone 232 without an existing inversion zone (due to previous recombination). When the inversion zone is switched off, only charge carriers are collected which reach the p-n junction between the substrate 10 and the contact zone 232 or the associated depletion zone by diffusion and are not destroyed before by recombination.

If the device shown in the inset of FIG. 3 is illuminated from the front side 101 (as illustrated for irradiations of three different wavelengths), when the inversion zone is switched on, the spectral sensitivity in the red and infrared range is improved, as light of these wavelengths generates charge carrier pairs deep within the silicon, which may now be extracted.

With an illumination from the backside 102, inverse conditions apply. The inversion zone then causes light of shorter wavelengths (e.g., blue light) to be able to contribute better to the photocurrent, as the charge carriers generated close to the backside 102 may be extracted or sucked off more efficiently.

The dimensions of the photodetector illustrated in the inset of FIG. 3 may be chosen as follows for informative and by no means limiting purposes. The p-region 236 serving as the substrate contact may have a width which is comprised in a range from 40 µm to 160 µm with a typical value being 80 µm. A gap between two trenches 218 has a width which may range from about 50 µm to about 200 µm. A typical value for the trench spacing may be 100 µm. The semiconductor substrate 10 has a thickness which may be comprised in a range from 40 µm to 500 µm, for example 225 µm. A distance between the second main surface 102 of the semiconductor substrate 10 and a lower end of the trenches may be comprised in a range from 1 µm to 10 µm, for example 2 µm, 5 µm, or 8 µm, as well as values in between. The indicated dimensions may also be used for corresponding structures of a photodetector according to embodiments to be described below.

From the basic functional principle of the structure shown in the inset in FIG. 3 described above, further variants of the device may be derived, which will be described below. Trench electrodes of different depths, which may be switched separately, enable a discrete spectral response which is varied with each trench depth. By a differential formation of the signals with a respectively switched on inversion zone, a spectral evaluation of the incoming light is thus possible. A more elegant variant to achieve a continuous evaluation of the light spectrum is achieved when the threshold voltage of the inversion zone varies along a trench into the depth. Then, the formation of the inversion zone with smaller voltages is only given in the upper region of the trench electrode and migrates into the depth with increasing voltages. Such an arrangement may, for example, be obtained when the dopant concentration is increased into the depth or the dielectric is implemented conically.

Apart from the possibility of being used as a spectrometer, the device of the inset in FIG. 3 has the advantage that with a minimum space requirement on the front side 101, an irradiation from the backside 102 may be evaluated. Thus, there is enough space for an evaluation circuit between the trench electrodes in the surrounding region. The space requirement of the irradiated zone is then substantially decoupled from the area used on the front side. This advantage is achieved without patterning or structuring processes being required on the backside 102 of the device.

A measurement of the passivated and non-passivated trench-diode configuration (the diode being formed by the p-doped substrate 10 and the n-doped contact zone 232) gives a picture of the extent of the effect mentioned above. In FIG. 3 a spectral response measurement of the MIS photocell device into switching states is depicted. In a first switching state, no bias is applied to the electrode 214, i.e., a voltage between the electrode 214 and the substrate 10 is approximately zero. In a second switching state, a bias voltage of 5V is applied between the electrode 214 and the substrate 10. It can be seen that the MIS photocell device behaves substantially identically in both switching states up to a wavelength of 500 nm. However, for larger wavelengths the MIS photocell device shows a larger spectral response in the second switching state (with bias (5V)) than in the first switching state (without bias).

The huge deviation of both curves at long wavelengths is clearly visible. This unexpected swing was fitted by means of simulation when considering interface recombination velocities as high as $10^6$ cm/s. Assuming such high recombination activity also at a lower boundary of a box shaped isolation, there would not be much photocurrent remaining when there is no active surface field.

Figure 4A:
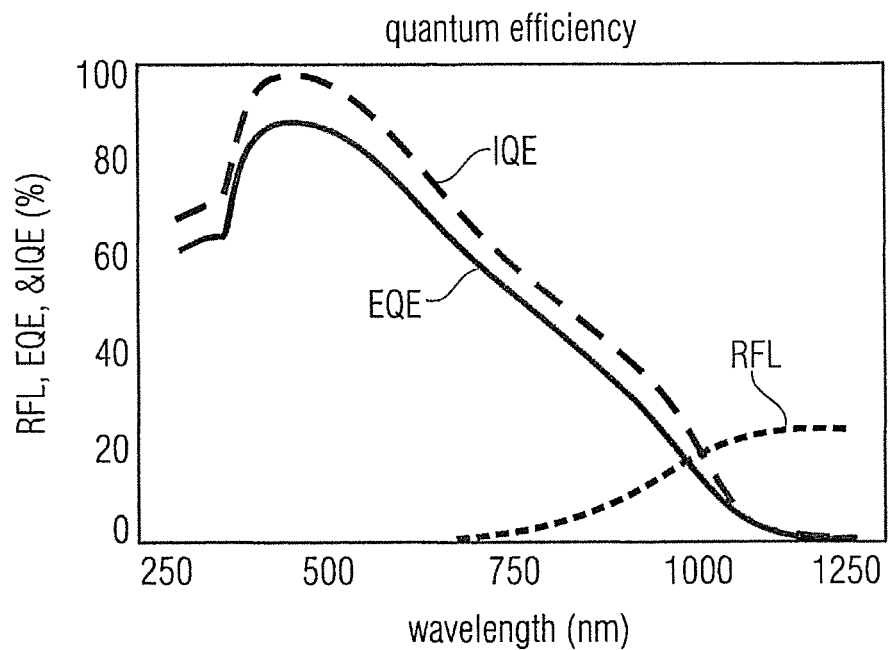
FIG. 4A shows a graph of various performance characteristics over wavelength obtained from a simulation of a photodiode having no surface charge at a rear side.
Figure 4B:
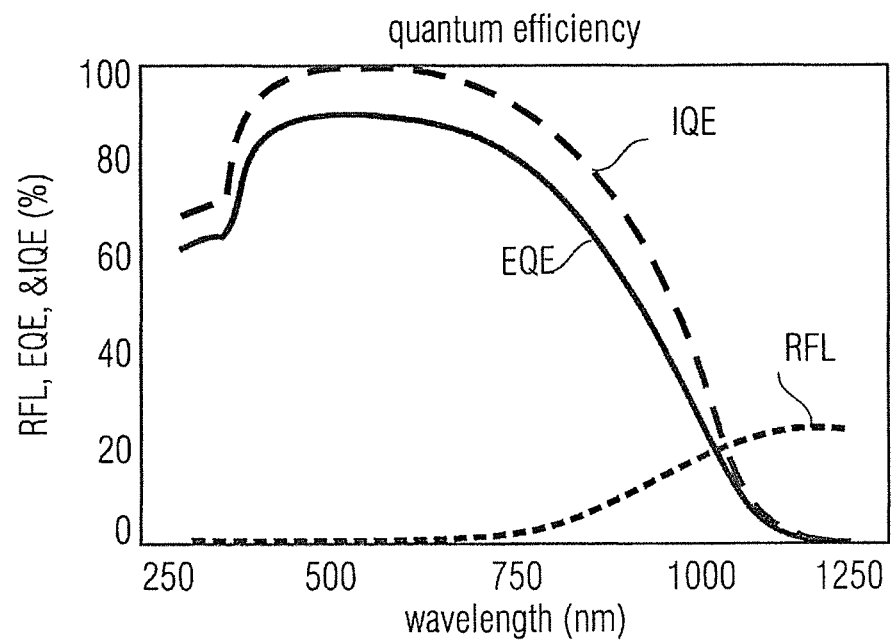
FIG. 4B shows a graph of various performance characteristics over wavelength obtained from a simulation of the photodiode from FIG. 4A with a surface charge at the rear side.

In FIGS. 4A and 4B the spectral quantum efficiencies for a 10 µm thick photodiode (see the insets in FIGS. 4A and 4B) are compared: in FIG. 4A a response of the photodiode having no surface charge is illustrated. In FIG. 4B a response of the photodiode is depicted, assuming a surface charge of $-10^{13}$ $cm^{-2}$ on the rear side of the device. The graphs in FIGS. 4A and 4B result from a 1D simulation of the internal quantum efficiencies (IQE), the external quantum efficiency (EQE), and reflection as a function of wavelength (RFL) of the 10 µm thick photodiode without (FIG. 4A) and with (FIG. 4B) an accumulation layer at the rear side. The external quantum efficiency (EQE) is understood herein as the ratio of the number of charge carriers collected by the device to the number of photons of a given energy shining on the device (incident photons). The internal quantum efficiency (IQE) is understood herein as the ratio of the number of charge carriers collected by the device to the number of photons of a given energy that are actually absorbed by the device. In FIG. 4A it can be seen that without the accumulation layer the internal quantum efficiency (IQE) is high in a relatively narrow range of wavelengths, i.e., the IQE is greater than 90% from approximately 400 nm to approximately 550 nm. In contrast, FIG. 4B shows that with a negatively charged accumulation layer at the rear side, the internal quantum efficiency (IQE) of the photodiode is larger than 90% over a wavelength range starting at approximately 400 nm and ending at approximately 750 nm.

Thus, to optimize the response of a pixel element, especially (but not exclusively) for infrared ranges, an active electrode structure for surface passivation may be considered.

The configuration schematically shown in the insets of FIGS. 4A and 4B (and also as provided by at least some of the embodiments described below) further provide the chance to produce two distinct responses and to use these two distinct responses for a spectral sensitive detection. Referring to FIG. 3, the difference of the two signals gives an integral information of intensity in the infrared range. A comparison of this difference and the curve corresponding to the "without bias" switching state is an estimate for the intensity in the visible range. To generalize this: in terms of the least squares method, an additional dimension is produced. This gives a smaller length of the projection of the real spectrum to the vector space defined by the measurement (the estimate of the real spectrum). Focusing on spectrometer applications, it is not necessarily a drawback to have high recombination activity at internal boundaries, contrarily—it may be favored to improve evaluation of a spectral composition of the incident light. Selectively switching on the biasing electrode arrangement may be used to selectively passivate one or more internal boundaries of a photoactive region (e.g., the confined region) within the substrate.

Embodiments provide a combination of a box shaped dielectric isolation with an electrode liner. The electrode is contacted and a voltage may be applied. The resulting surface charge alters the spectral response of the device. That may be used to boost the internal quantum efficiency. Alternatively, a comparison of signals of distinct switching states may be used for spectral evaluation. Further embodiments provide a box shaped isolation in combination with (biasing) electrodes on sidewalls only. The dielectric isolation may have shapes other than a box, for example, the dielectric isolation (the insulating arrangement) may be shaped as a cylinder, a triangular prism, a hexagonal prism, or another shape having upper and lower faces that are substantially parallel to the main surface of the substrate and lateral faces that are substantially orthogonal to the main surface of the substrate. Instead of an electrode liner, the biasing electrode arrangement may be provided as a structure that is adjacent to the dielectric isolation at a side of the dielectric isolation that is opposite to the photoactive region within the substrate. In embodiments the biasing electrode arrangement may partly or completely surround the dielectric isolation at least laterally.

Figure 5:
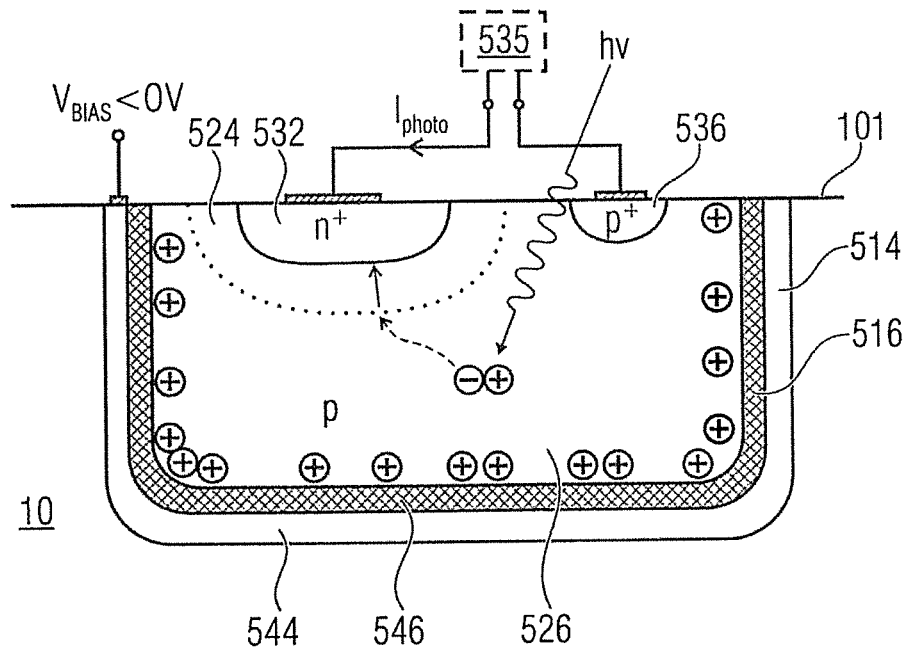
FIG. 5 shows a schematic cross section of a photodetector according to at least some embodiments.

FIG. 5 shows a schematic cross section of a photodetector according to embodiments. The photodetector is formed in a substrate 10 and comprises an insulating arrangement, a read-out electrode arrangement, and a biasing electrode arrangement. The insulating arrangement comprises an insulating layer 546 and one or more insulating sidewalls 516. The insulating layer 546 is substantially parallel to a main surface 101 of the substrate 10. The insulating sidewalls 516 may be based on, or part of, a trench arrangement extending from the main surface 101. In the embodiment illustrated in FIG. 5 the insulating sidewalls 516 may have been obtained by first forming the trench arrangement from the main surface 101 and then oxidizing the trench walls. The insulating arrangement delimits a confined region 526 of the substrate 10. The biasing electrode arrangement comprises an electrode layer 544 and one or more electrode sidewalls 514. The electrode layer 544 and the one or more electrode sidewalls 514 are electrically connected to each other. The biasing electrode arrangement is connectable to a voltage source (not shown) capable of applying a bias voltage $V_{BIAS}$ to the biasing electrode arrangement relative to an electrical potential of the substrate 10. The biasing electrode arrangement is adjacent to the insulating arrangement and surrounds the insulating arrangement laterally and also at a bottom surface of the insulating layer 546 which is substantially parallel to the main surface 101 of the substrate 10. Applying a bias voltage $V_{BIAS}$ smaller than zero ($V_{BIAS}<0$) to the biasing electrode arrangement 514, 544 (relative to an electrical potential of the confined region 526) attracts the positively charged holes (majority charge carriers) within the confined region 526 to the boundary or interface between the confined region 526 and the insulating arrangement 516, 546. In this manner, the interface/boundary between the confined region 526 and the insulating arrangement 516, 546 is (additionally) passivated due to the surface charge.

In the embodiment shown in FIG. 5 the substrate 10 and the confined region 526 are p-doped. A highly doped n-region 532 is formed within the confined region 526 at the main surface 101 of the substrate 10. Furthermore, a highly doped p-region 536 is also formed within the confined region 526 at the main surface 101. The n-region 532 and the p-region 536 are part of the read-out electrode arrangement. The n-region 532 and the p-region 536 are connected to a read-out circuitry 535. A photocurrent $I_{photo}$ flows via the n-region 532 and the p-region 536 and is thus exchanged between the confined region 526 and the read-out circuitry 535. The p-doped confined region 526 and the n-region 532 form a pn junction so that a depletion zone 524 is formed within the confined region 526.

An incident photon hv may be absorbed within the confined region 526 and thus lead to a generation of a pair of free charge carriers, i.e., a negatively charged electron and a positively charged hole. The confined region 526 is p-doped so that the generated free electron belongs to the minority charge carriers and the generated free hole belongs to the majority charge carriers in the confined region 526. In FIG. 5 the generated free electron has been generated outside the depletion region 524. In order for the generated free electron to contribute to the photocurrent $I_{photo}$, the generated free electron first has to reach the depletion zone 524 by means of diffusion (dashed arrow). Diffusion of free charge carriers within a semiconductor is mostly governed by local concentration variations of the charge carriers within the semiconductor, i.e., diffusion is a function of spatial charge carrier distribution within the semiconductor. A better passivation of internal boundaries typically prevents that the charge carrier concentration exhibits a pronounced minimum at the internal boundaries. A pronounced concentration minimum would cause a strong diffusion of charge carriers towards the internal boundaries and hence result in relatively high recombination rates. The better passivation of the boundary between the confined region 526 and the insulating arrangement 516, 546 achieved by applying a negative bias voltage to the biasing electrode arrangement 514, 544 counteracts the formation of such pronounced concentration minima at the boundary and therefore increases the probability of a generated free electron to reach the depletion zone 524 by diffusion and to subsequently contribute to the photocurrent $I_{photo}$.

There is a certain chance that the free electron recombines with a free hole while diffusing from the site of its generation to the edge of the depletion zone 524. Once the generated free electron has entered the depletion zone 524, it drifts towards the n-region 532 under the influence of an electric field within the depletion zone 524. Within the depletion zone 524 the probability for recombination is typically significantly lower than in the rest of the confined region 526.

Although not explicitly shown in FIG. 5, the biasing electrode arrangement 514, 544 may be electrically insulated against the surrounding substrate 10.

Figure 6:
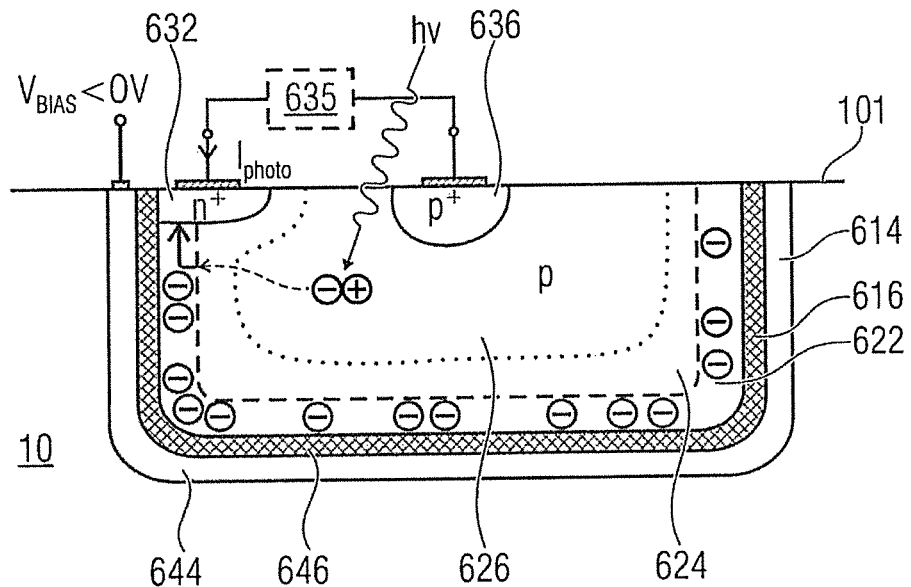
FIG. 6 shows a schematic cross section of a photodetector according to at least some embodiments.

FIG. 6 shows a schematic cross section of a photodetector similar to the photodetector shown in FIG. 5. The difference is that the biasing electrode arrangement of the photodetector illustrated in FIG. 6 is connectable to a bias voltage $V_{BIAS}$ greater than zero ($V_{BIAS}$>0) relative to the substrate 10, thus leading to an attraction of the minority charge carriers (i.e., the electrons) from the inside of the confined region 626 to the boundary between the confined region 626 and the insulating arrangement 616, 646. The photodetector further comprises the biasing electrode arrangement 614, 644. The biasing electrode arrangement comprises one or more electrode sidewalls 614 and an electrode layer 644. Within the confined region 626 and adjacent to the main surface 101 of the substrate 10, an n-region 632 and a p-region 636 are provided that constitute contact areas for the external read-out circuitry 635. Reference is made to the description of the n-region 532, the p-region 536, and the read-out circuitry 535 in the context of FIG. 5. Note that in the embodiment of FIG. 6 the n-region 632 is at another location than in the embodiment of FIG. 5. In particular, in the embodiment of FIG. 6 the n-region 632 is adjacent to one of the insulating sidewalls 616 of the insulating arrangement.

The application of a positive bias voltage $V_{bias}$>0 to the biasing electrode arrangement 614, 644 causes the minority charge carriers within the p-doped confined region 626 to be attracted to the boundary between the confined region 626 and the insulating arrangement 616, 646. When the concentration of the minority charge carriers at the boundary becomes high enough that additional minority charge carriers can no longer find a recombination partner, an inversion zone 622 is formed within the confined region 626 immediately adjacent to the insulating arrangement 616, 646. Due to the abundance of minority charge carriers within the inversion zone 622, the inversion zone 622 features a high electrical conductivity and thus acts as a conductive channel. A free minority charge carrier generated by an incident photon hv within the confined region 626 may first reach the depletion zone 624 via a diffusion process (dashed line), then drift through the depletion zone 624 (solid line arrow), and finally be conducted within the inversion zone 622 (double line arrow) to the n-region 632 where it may contribute to the photocurrent $I_{photo}$.

The concept of a photodetector schematically illustrated in FIGS. 5 and 6 may be combined with a trench MIS photocell as illustrated in the inset of FIG. 3 featuring a tunable spectral response. U.S. patent application Ser. No. 13/232,564, the content of which is incorporated herein in its entirety by reference, describes various trench MIS photocell configurations which may be combined with the concept of surface passivation according to embodiments of this present patent application.

Figure 7:
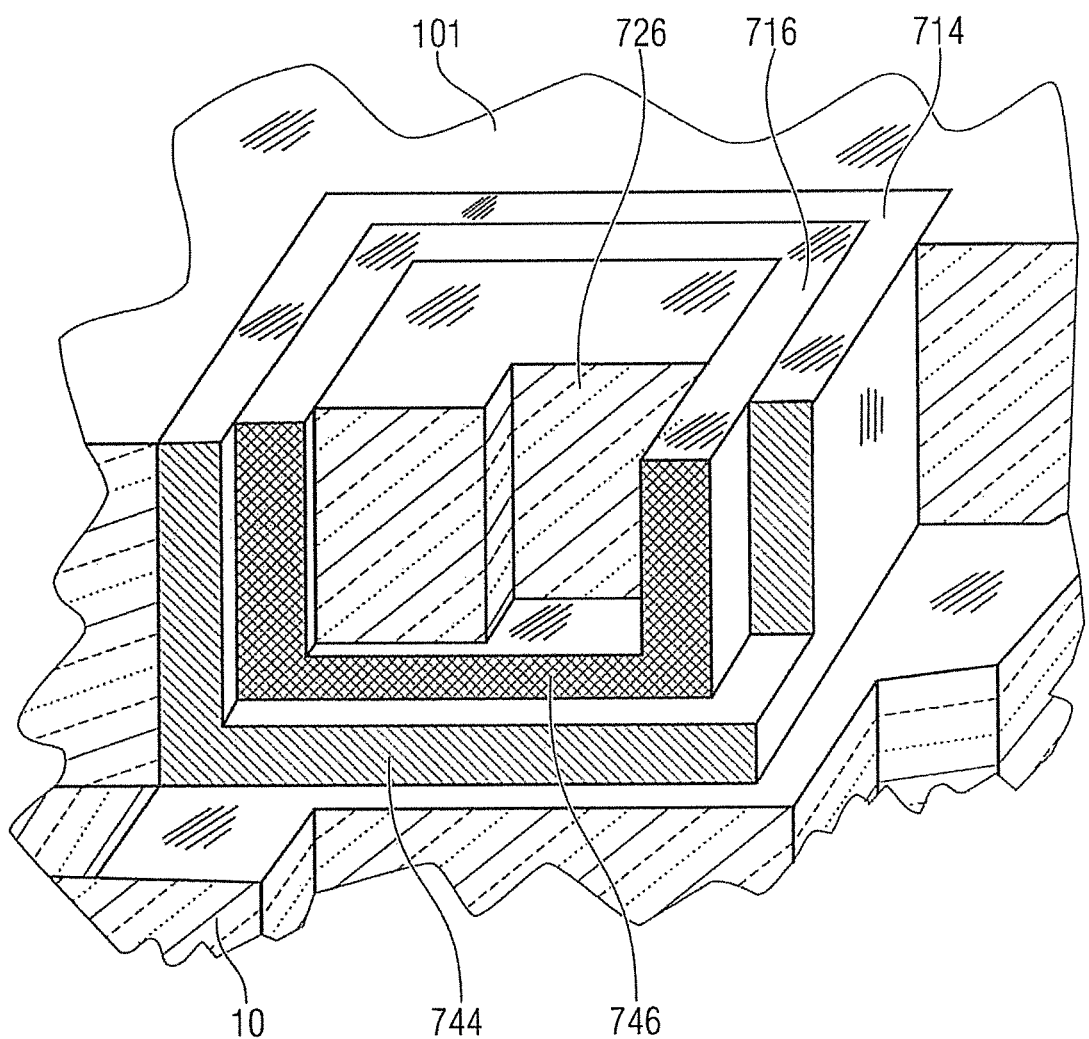
FIG. 7 shows a schematic, perspective breakout view of a photodetector according to at least some embodiments.

FIG. 7 shows a schematic, perspective breakout view of a photodetector according to embodiments. The photodetector comprises a confined region 726 which is electrically insulated against the surrounding substrate 10 by means of an insulating arrangement. The insulating arrangement comprises an insulating bottom layer 746 and several insulating sidewalls 716. For example, the insulating arrangement may comprise four insulating sidewalls 716, three of which are visible in FIG. 7. The insulating arrangement is thus shaped as an open box in the embodiment illustrated in FIG. 7.

The photodetector further comprises a biasing electrode arrangement formed by a bottom electrode layer 744 and several electrode sidewalls 714, three of which are visible in FIG. 7. The biasing electrode arrangement 714, 744 surrounds the insulating arrangement 716, 746 at all sides except for a top surface that is substantially flush with the main surface 101 of the substrate 10. The biasing electrode arrangement 714, 744 may also be electrically insulated against the surrounding substrate 10, although this is not shown in FIG. 7. The biasing electrode arrangement 714, 744 may be electrically biased with respect to the confined region 726 by applying a bias voltage between the biasing electrode arrangement and the confined region. As mentioned above, setting the biasing electrode arrangement 714, 744 to a different electrical potential than the confined region 726 has an influence on the spatial charge carrier distribution within the confined region. In this manner, the internal boundaries between the confined region 726 and the insulating arrangement 716, 746 may become (additionally) passivated, thus reducing a recombining action of free charge carriers within the confined region 726 at the internal boundaries.

The main surface 101 and the top surfaces of the insulating arrangement 716, the biasing electrode arrangement 714, and the confined region 726 may be covered by further layers or structures not shown in FIG. 7 for the sake of clarity. Furthermore, electronic components such as transistors, diodes, resistors, connections, etc. may be provided at the main surface 101 for controlling and reading-out the photodetector.

Figure 8:
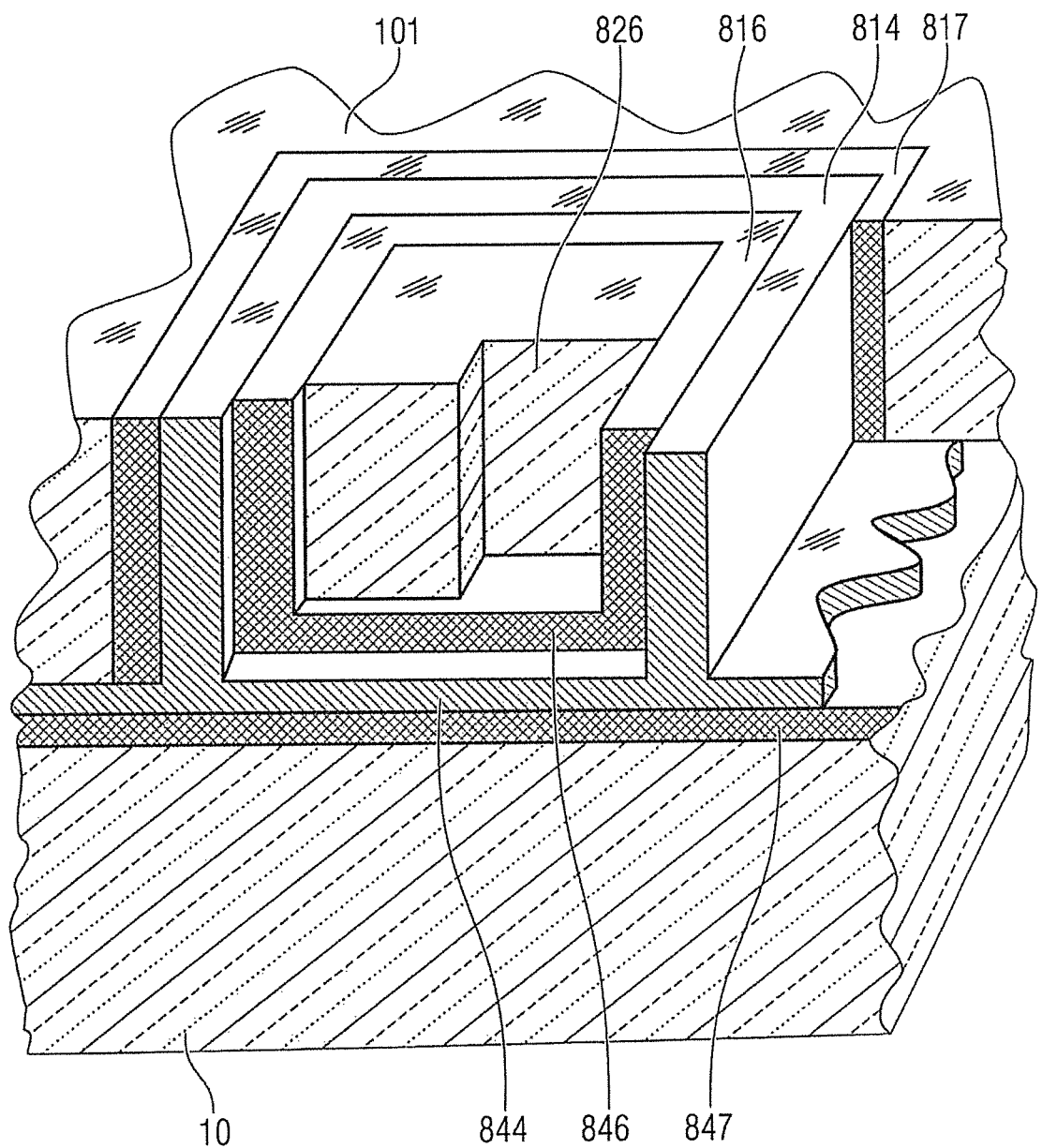
FIG. 8 shows a schematic, perspective breakout view of a photodetector according to at least some embodiments.

FIG. 8 shows a schematic, perspective breakout view of a photodetector according to some embodiments. The embodiment illustrated in FIG. 8 is similar to the embodiment illustrated in FIG. 7. The photodetector schematically illustrated in FIG. 8 comprises an insulating arrangement 816, 846, 817, 847 which delimits (at five sides) a confined region 826 of the substrate 10. The biasing electrode arrangement comprises several sidewalls 814 and a continuous bottom layer 844 which is electrically connected to the sidewalls 814. In the embodiment illustrated in FIG. 8, the electrode sidewalls 814 merge with the continuous bottom layer 844 of the biasing electrode arrangement. The insulating arrangement comprises inner insulating sidewalls 816, an inner or upper insulating bottom layer 846, outer insulating sidewalls 817, and an outer or lower insulating bottom layer 847. The electrode sidewalls 814 are laterally surrounded by the inner insulating sidewalls 816 and the outer insulating sidewalls 817. The continuous electrode bottom layer 844 is located between the upper insulating bottom layer 846 and the lower insulating bottom layer 847.

The insulating arrangement and the biasing electrode arrangement of the embodiment illustrated in FIG. 8 may be obtained by a combination of a VENEZIA process and trenches formed in the substrate 10 that extend from the main surface 101 down to a depth of the layer structure formed by the VENEZIA process (see FIGS. 1 and 2). The walls of the trenches and of the buried channels may be trans-formed into an insulating material, for example by means of an oxidizing process. In the case of the buried channels, such an oxidation may already be a part of the VENEZIA process. The cavities within the trenches and the buried channels may then be filled with an electrode material, for example, a polycrystalline silicon. This may be achieved by a suitable deposition process, for example chemical vapor deposition.

FIGS. 9A to 9E schematically illustrate cross sections of the substrate 10 and structures formed therein during various stages of a manufacturing process for obtaining a photodetector according to embodiments.

Figure 9A:
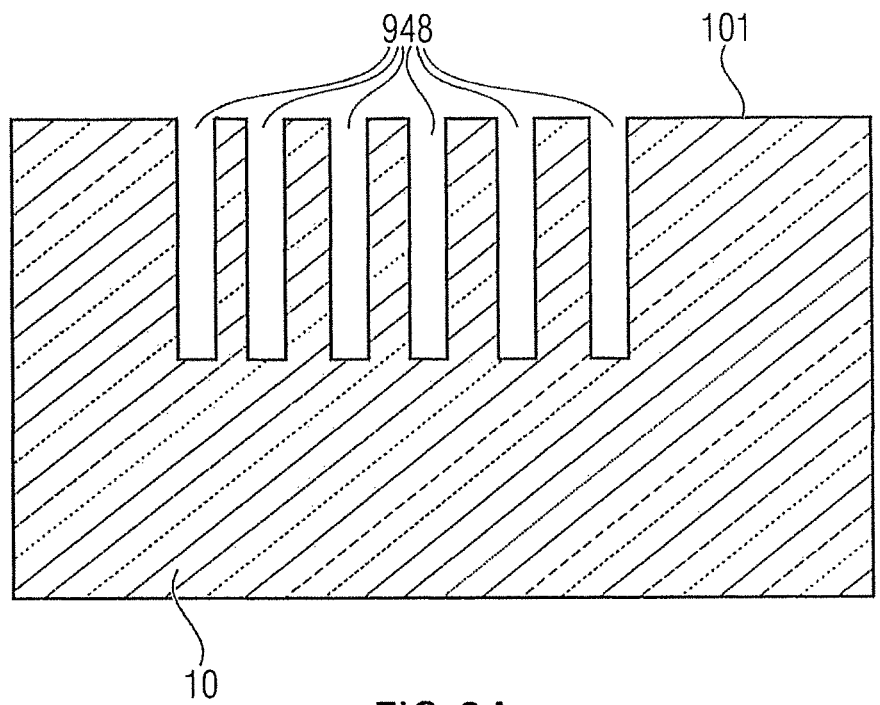
FIGS. 9A to 9E show schematic cross sections illustrating various stages of a method for manufacturing a photodetector according to at least some embodiments.

FIG. 9A shows the substrate 10 after a plurality of deep trenches 948 has been formed in the substrate, starting at the main surface 101. The trenches 948 may be obtained by a dry etching process, a reactive ion etching (RIE) process, a deep reactive ion etching (DRIE), a Bosch process, etc. In case the substrate material is silicon, silicon dioxide may be used as an etching mask material. After removal of the etching mask, the substrate may be annealed in a deoxidizing ambient. According to the empty-space-in-silicon (ESS) technique, the annealing ambient is kept in a low $H_2O$ partial pressure condition so as to remove native oxide and to promote smooth surface migration. In this manner, the trenches 948 are closed and cavities are formed within the substrate 10.

Figure 9B:
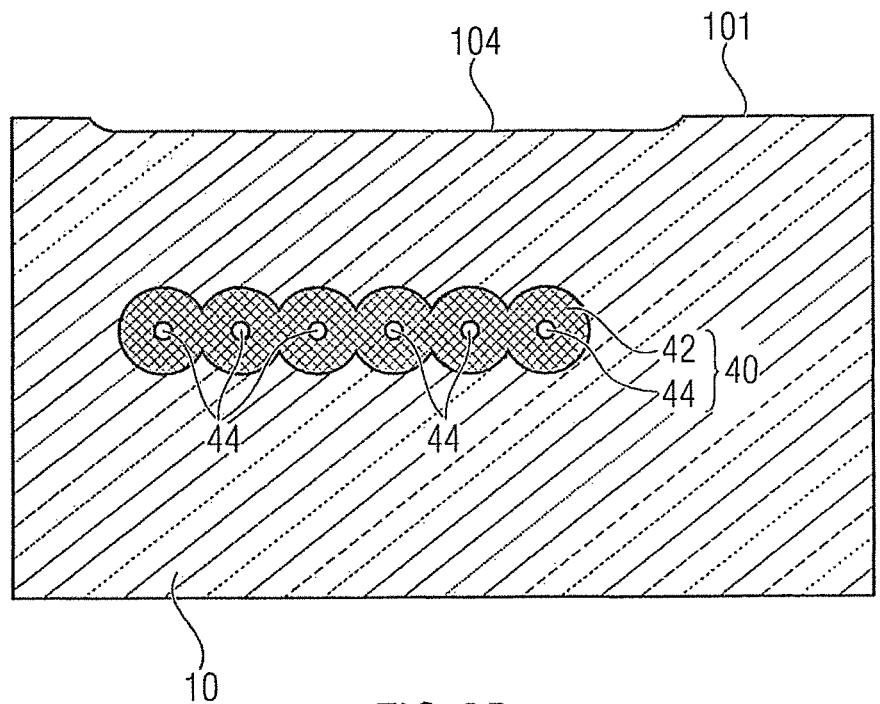

FIG. 9B shows the substrate 10 after the completion of the annealing step. The layer 40 has been obtained at a certain depth within the substrate 10 from the main surface 101. The layer 40 comprises a plurality of buried channels or cavities 44 and buried oxide 42. The buried oxide 44 substantially encloses the buried channels 42. FIG. 9B substantially illustrates the result of performing a VENEZIA process or of an empty-space-in-silicon (ESS) process. The VENEZIA and/or the ESS process may lead to the formation of a depression or recess 104 at the main surface 101. The depth of the cavities 44 may be slightly smaller than an original depth of the trenches 948.

Figure 9C:
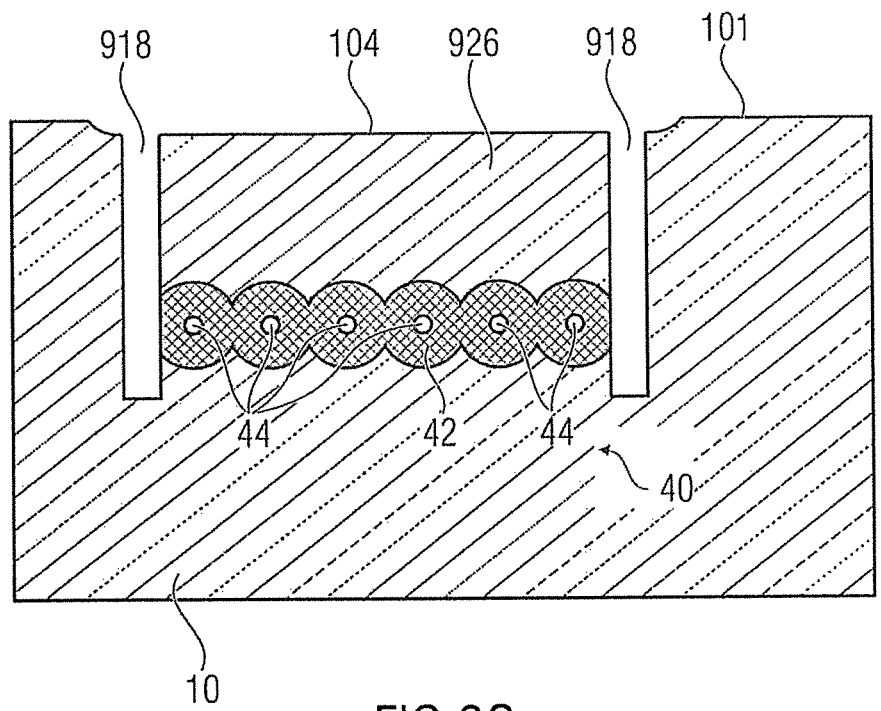

As illustrated in FIG. 9C, further trenches 918 are formed in the substrate 10 that extend from the main surface 101 into the substrate 10. The depth of the trenches 918 may typically be at least the depth at which the plurality of cavities or buried channels 44 are located. In FIG. 9C, two trenches 918 are illustrated that extend substantially parallel to the buried channels 44. Although not depicted in FIG. 9C, one or more further trenches may be formed concurrently with the two illustrated trenches 918, the further trenches being perpendicular to the two illustrated trenches 918, i.e., extending from left to right in the representation of FIG. 9C. For example, such a further trench may connect the two depicted trenches 918 and also open up the buried channels or cavities 44. The trenches 918 and the layer 40 delimit the confined region 926 of the substrate 10.

Figure 9D:
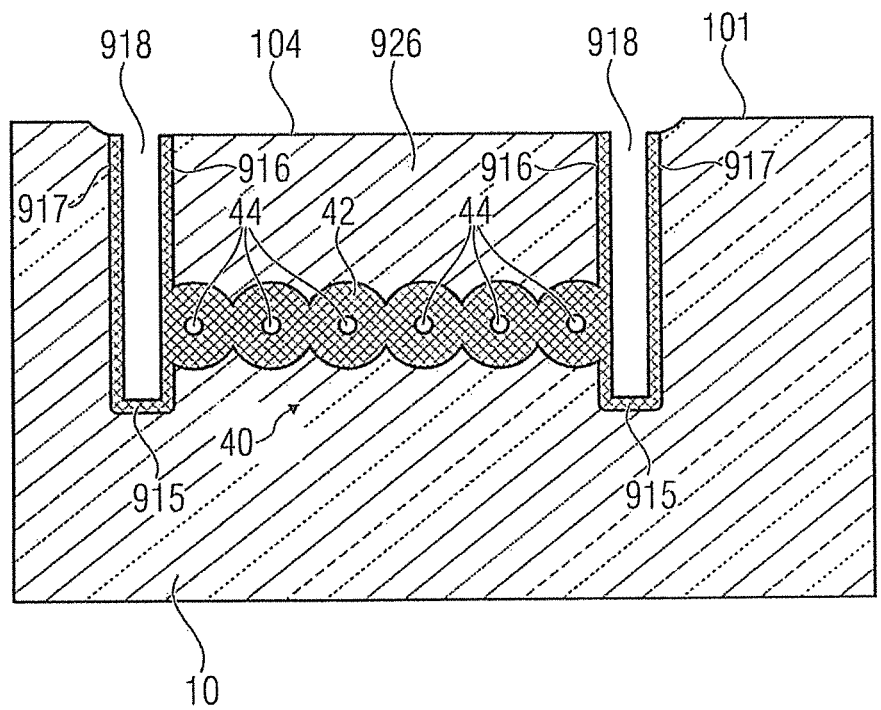

The sidewalls of the trenches 918 are then electrically insulated, for example by means of an oxidation process, a deposition process, and/or an epitaxial process. FIG. 9D illustrates this stage of the manufacturing process in which the substrate and the structures formed in the substrate, in particular the sidewalls of the trenches 918, have been insulated and now form insulating sidewalls 916, 917. Also the bottoms of the trenches 918 are now insulated against the surrounding substrate 10 by means of an insulating material 915.

Figure 9E:
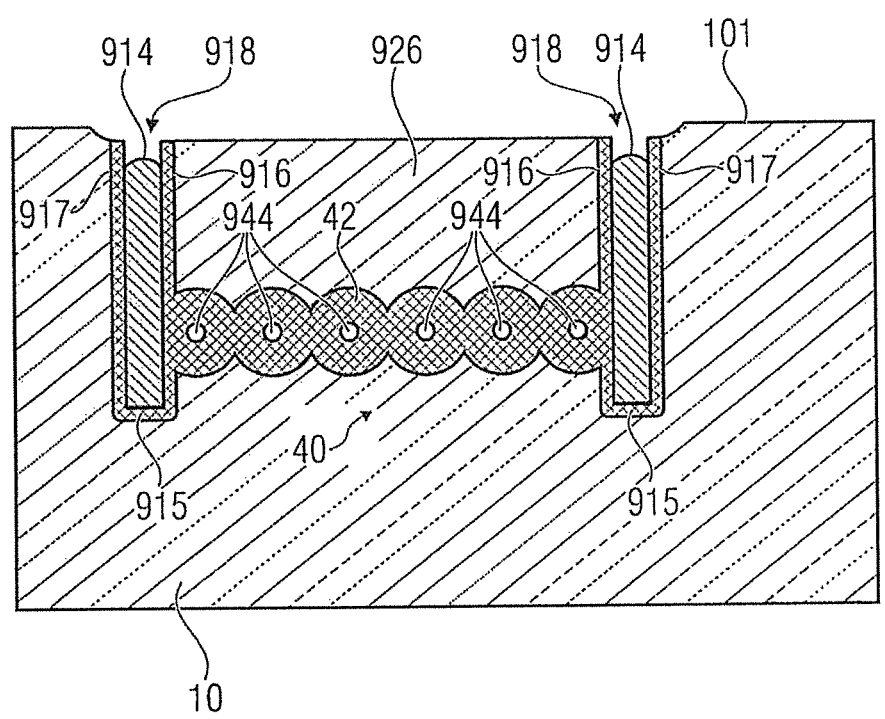

FIG. 9E schematically illustrates the substrate 10 after the remaining cavities of the trenches 918 have been filled with an electrode material 914. Also the buried channels are filled with an electrode material 944, which is possible by means of the trenches extending substantially parallel to the drawing plane of FIG. 9E and previously having opened the buried channels 44 as explained in the context of FIG. 9C. Now the confined region 926 is delimited by the insulating arrangement which comprises the insulating sidewalls 916, 917 and the buried oxide 42. A biasing electrode arrangement which at least partially surrounds the confined region 926 comprises the electrode material 914 filled into the trenches 918 and the electrode material 944 filled into the buried cavities. The trench electrode material 914 may be electrically connected with the cavity electrode material 944. In alternative embodiments, the trench electrode material 914 and the cavity electrode material 944 may be insulated against each other and connected to separate voltage sources so that their electrical potentials may be controlled independently from each other. In yet another possible embodiment the cavity electrode material 944 and the trench electrode material 914 may be individually connectable to a common biasing voltage source by means of dedicated switches so that various switching states can be provided, e.g.: 1) trench electrode material 914 and cavity electrode material 944 unbiased, 2) trench electrode material 914 unbiased and cavity electrode material 944 biased, 3) trench electrode material 914 biased and cavity electrode material 944 unbiased, and 4) trench electrode material 914 and cavity electrode material 944 biased. Using these four different switching states, different spectral responses of the photodetector can be provided. Of course, the biasing electrode arrangement may be further subdivided, such that individual sidewalls 914 of the biasing electrode arrangement can be individually controlled. Furthermore, it is also conceivable that the cavity electrode material 944 is subdivided in two or more portions that are individually controllable in terms of bias voltage. Such an individual control of portions of the biasing electrode arrangement may be used to modify the spectral response of the photodetector to boost different wavelength ranges and to thus provide an option for a relatively exact analysis of the spectrum of the incident light or irradiation.

Figure 10A:
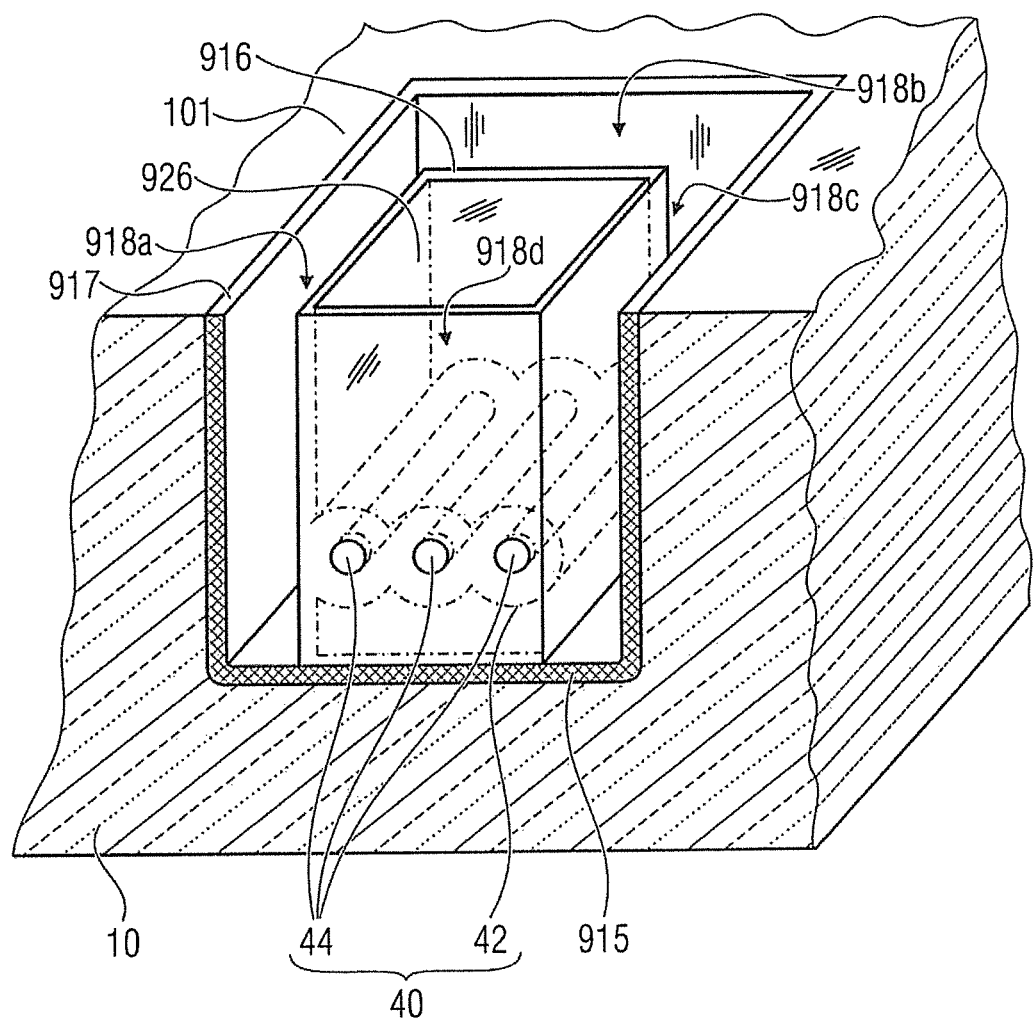
FIG. 10A shows a schematic, perspective breakout view of a photodetector according to at least some embodiments at an intermediate stage of a manufacturing process.
Figure 10B:
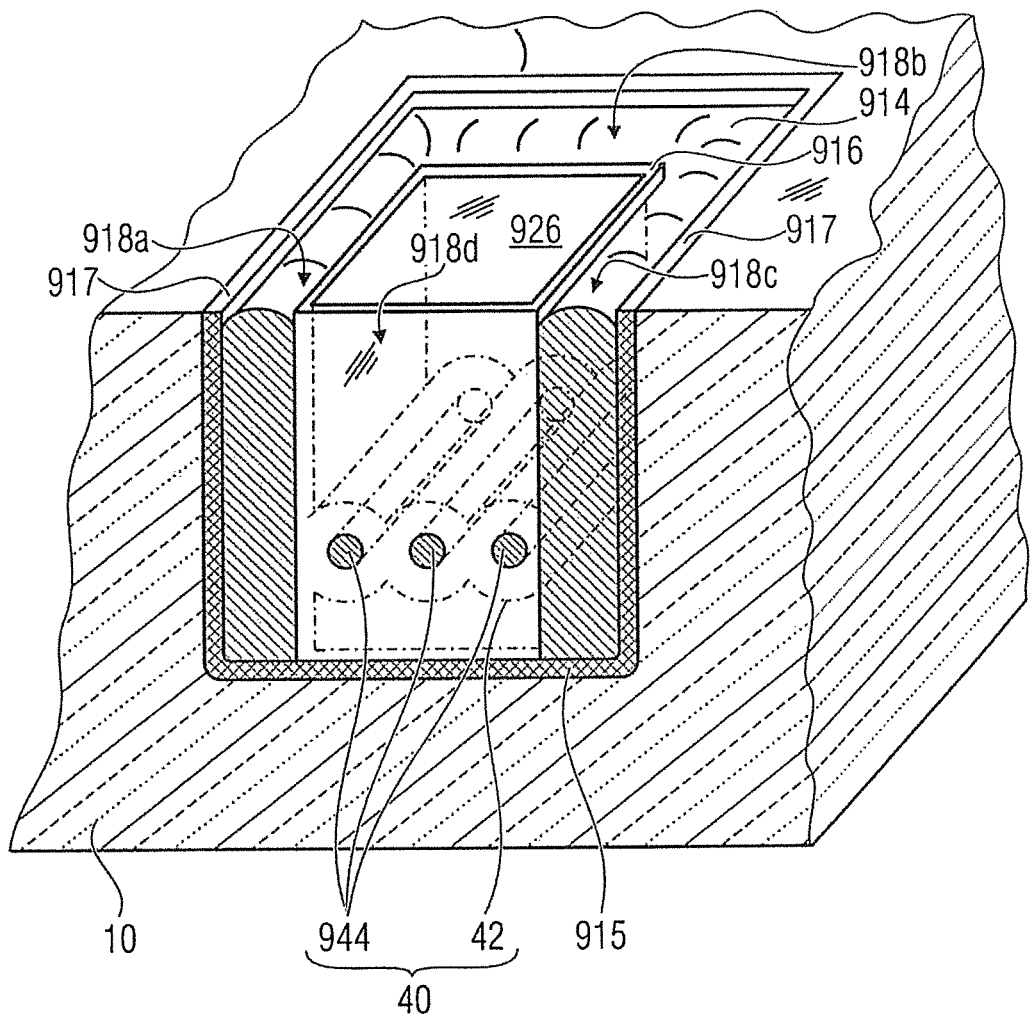
FIG. 10B shows a schematic, perspective breakout view of a photodetector according to at least some embodiments at a subsequent stage of the manufacturing process.

FIGS. 10A and 10B schematically illustrate as cross-sectional, perspective views the two stages of the manufacturing process that are illustrated in schematic cross-sectional views in FIGS. 9D and 9E. FIG. 10A corresponds to the stage of the manufacturing process at which the sidewalls of the trenches 918 have been electrically insulated against the surrounding substrate 10 by means of insulating outer sidewalls 917, insulating inner sidewalls 916 and insulating trench bottoms 915. For better reference, individual reference signs 918a, 918b, 918c, and 918d have been given to the four trenches that are visible in FIG. 10A. Note that the front sidewall of the trench 918d is not shown in the cross-sectional view of FIG. 10A. The confined region 926 is delimited against the bottom by the insulating layer 40 that is constituted, in this embodiment and at this stage of the manufacturing process, by the buried oxide 42 and the buried cavities 44. At the manufacturing stage illustrated in FIG. 10A the buried cavities 44 are not yet filled with an electrode material. The buried cavities 44 are substantially tube-shaped and extend in a substantially parallel direction to the trenches 918a and 918c. While the trenches 918b and 918d were formed, the cavities 44 were opened so that the trenches 918b and 918d communicate with the cavities 44.

FIG. 10B is a schematic, perspective cross sectional view of the photodetector after the electrode material 914, 944 has been filled into the trenches 918a to 918d and the buried cavities 44, respectively. As mentioned above, the buried cavities 44 (FIG. 10A) communicate with the trenches 918b and 918d so that, at the stage of the manufacturing process illustrated in FIG. 10B and also in the finished photodetector, the cavity electrode material 944 is electrically connected with the trench electrode material 914 in one embodiment.

Figure 11:
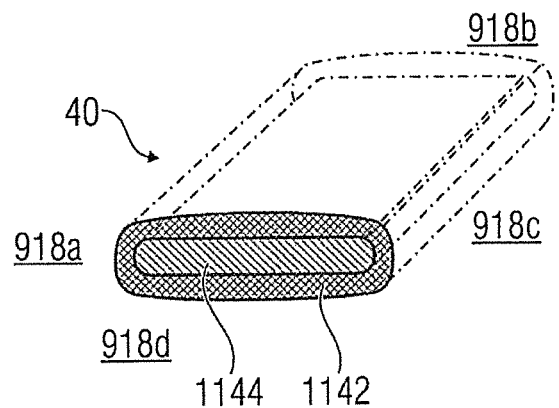
FIG. 11 shows an alternative for an insulating layer and a biasing electrode layer that may replace the corresponding insulating layer and biasing electrode layer illustrated in FIG. 10B.

FIG. 11 schematically illustrates an alternative configuration of the insulating layer 40 which may be provided instead of the insulating layer 40 illustrated in FIG. 10B. The three tube shaped cavities 44 of the embodiment shown in FIG. 10A are replaced in the embodiment according to FIG. 11 by a substantially plate shaped cavity. This may be achieved by reducing a spacing of trenches that are formed during the Venice process (VENEZIA process) or the ESS process and that are the basis for the later formation of the cavities within the substrate. FIG. 11 illustrates the insulating layer 40 with the cavity electrode material 1144 being provided within the plate shaped cavity. The buried oxide 1142 surrounds the cavity electrode material 1144. For reference, the locations of the four trenches 918a to 918d are also indicated in FIG. 11. Note that the cavity electrode material 1144 cannot extend all the way through to the trenches 918a and 918c everywhere, but that a certain thickness of the buried oxide 1142 needs to be provided in this region, at least at some locations. The reason is that the buried oxide 1142 needs to temporarily support the confined region 926 during the manufacturing process when the cavity is not yet filled, for example between the stages illustrated in FIGS. 9C and 9E. However, it may be sufficient to provide one or several columns that support the confined region 926 during the manufacturing process. For example, such columns may be located at the corners of the rectangular trench arrangement formed by the four trenches 918*a* to 918*d*. Once the cavity or the cavities has/have been filled with an electrode material 1144, the electrode material 1144 assists in supporting the confined region 926. The cavity electrode material 1144 illustrated in FIG. 11 may provide a more homogeneous electric field for passivation of the internal boundary between the confined region 926 and the buried oxide 1142.

According to embodiments a photodetector may comprise a substrate and means for electrically insulating a confined region of the substrate. The insulating arrangement mentioned and described above may be regarded as an example of the means for electrically insulating the confined region of the substrate. As mentioned above, the confined region is typically configured to generate free charge carriers in response to an irradiation during operation of the photodetector. The photodetector may further provide means for providing a photocurrent as an output of the photodetector, the photocurrent being formed by at least a portion of the free charge carriers that are generated in response to the irradiation. The read-out electrode arrangement mentioned and described above may be regarded as an example of the means for providing the photocurrent as an output of the photodetector. The photodetector may further comprise means for influencing a spatial charge carrier distribution within the confined region. The biasing electrode arrangement mentioned and described above may be regarded as an example of the means for influencing a spatial charge carrier distribution. The means for influencing may assume a biased state and an unbiased state. In embodiments, the biased state may be divided in a plurality of sub states. In the biased state of the means for influencing the spatial charge carrier distribution fewer of the free charge carriers that are present within the confined region recombine at boundaries of the combined region compared to the unbiased state. The means for influencing are formed within the substrate and insulated against the confined region by the means for insulating the confined region. When it is said that the means for influencing are formed within the substrate, this also includes a configuration in which the means for influencing are actually formed within the means for electrically insulating the confined region, which themselves are formed within the substrate.

Figure 12:
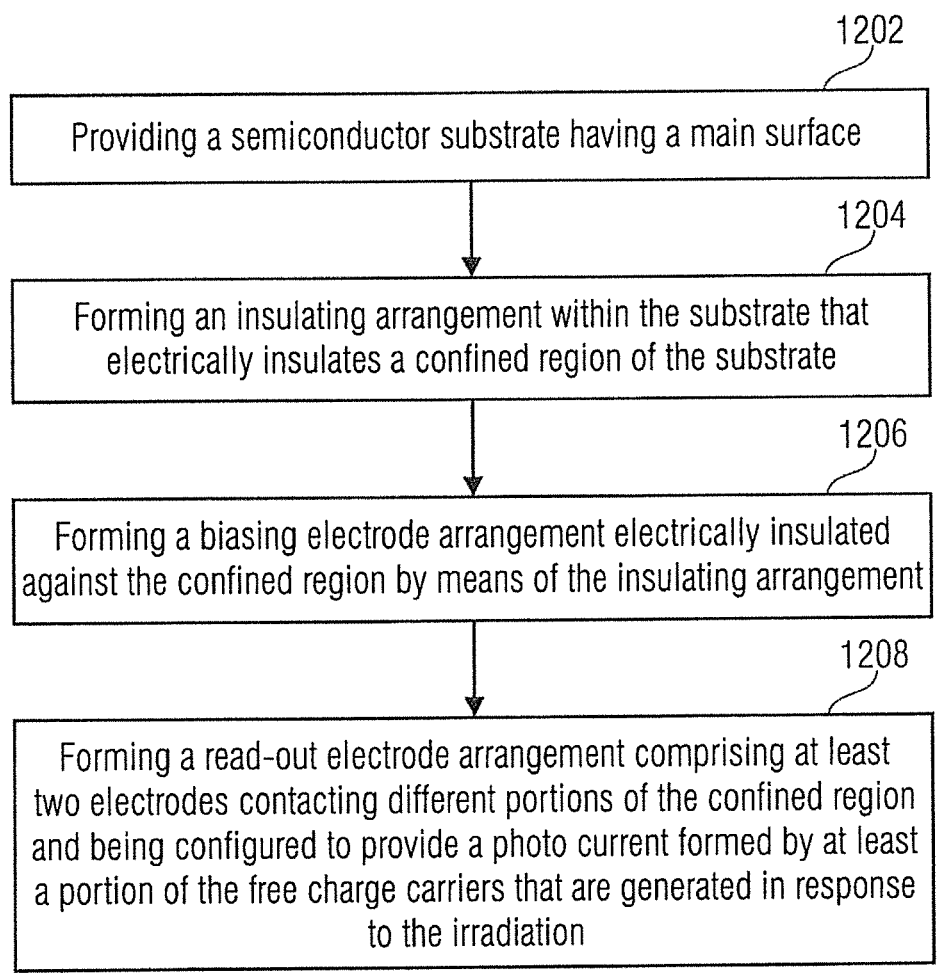
FIG. 12 shows a schematic flow diagram of a method for manufacturing a photodetector according to embodiments.

FIG. 12 shows a schematic flow diagram of a method for manufacturing a photodetector according to embodiments. At 1202, the semiconductor substrate is provided. The semiconductor substrate has a main surface. At 1204 an insulating arrangement is formed within the substrate. The insulating arrangement electrically insulates a confined region of the substrate. In embodiments, the formation of the insulating arrangement may in particular comprise the formation of an insulating layer. For example, the insulating layer may be formed using a Venice process (VENEZIA process) or an empty-space-in-silicon (ESS) process. A silicon-on-insulator (SOI) process may also be used in some embodiments. The insulating layer is typically substantially parallel to the main surface of the substrate. The formation of the insulating arrangement may further comprise the formation of a trench arrangement. This may be achieved by etching at least one trench from the main surface into the substrate so that it reaches the insulating layer. In embodiments the at least one trench may extend even deeper into the substrate than the depth of the insulating layer.

In case a trench arrangement is provided, sidewalls of the trench arrangement may be oxidized so that the sidewalls are of an electrically insulating oxide of the semiconductor material of the substrate. Oxidizing the sidewalls may comprise thermal treatment, a deposition process, epitaxy, or another suitable process. Furthermore, the trench arrangement may be filled or lined with an electrically conducting electrode material.

In case an insulating layer is formed within the substrate, at least one cavity may be formed within the insulating layer during the formation of the insulating layer.

At 1206 of the method for manufacturing schematically illustrated by the flow diagram of FIG. 12, a biasing electrode arrangement may be formed within the substrate or within the previously formed insulating arrangement. To this end, the above-mentioned at least one cavity within the insulating layer may be filled or lined with an electrically conducting electrode material. In embodiments, filling or lining the at least one cavity with the electrically conducting electrode material may be performed substantially concurrently with filling or lining the trench arrangement with the electrically conducting electrode material. The biasing electrode arrangement is electrically insulated against the confined region by means of the insulating arrangement.

The method of manufacturing at 1208 further comprises forming a read-out electrode arrangement. The read-out electrode arrangement comprises at least two electrodes. Each electrode of the at least two electrodes contacts a different portion of the confined region. The read-out electrode arrangement is configured to provide a photocurrent formed by at least a portion of the free charge carriers that are generated, during an operation of the photodetector, within the confined region in response to an irradiation. The read-out electrode arrangement may in particular comprise highly doped regions at the main surface of the confined region. These highly doped regions may be formed by, for example, ion implantation.

Figure 13:
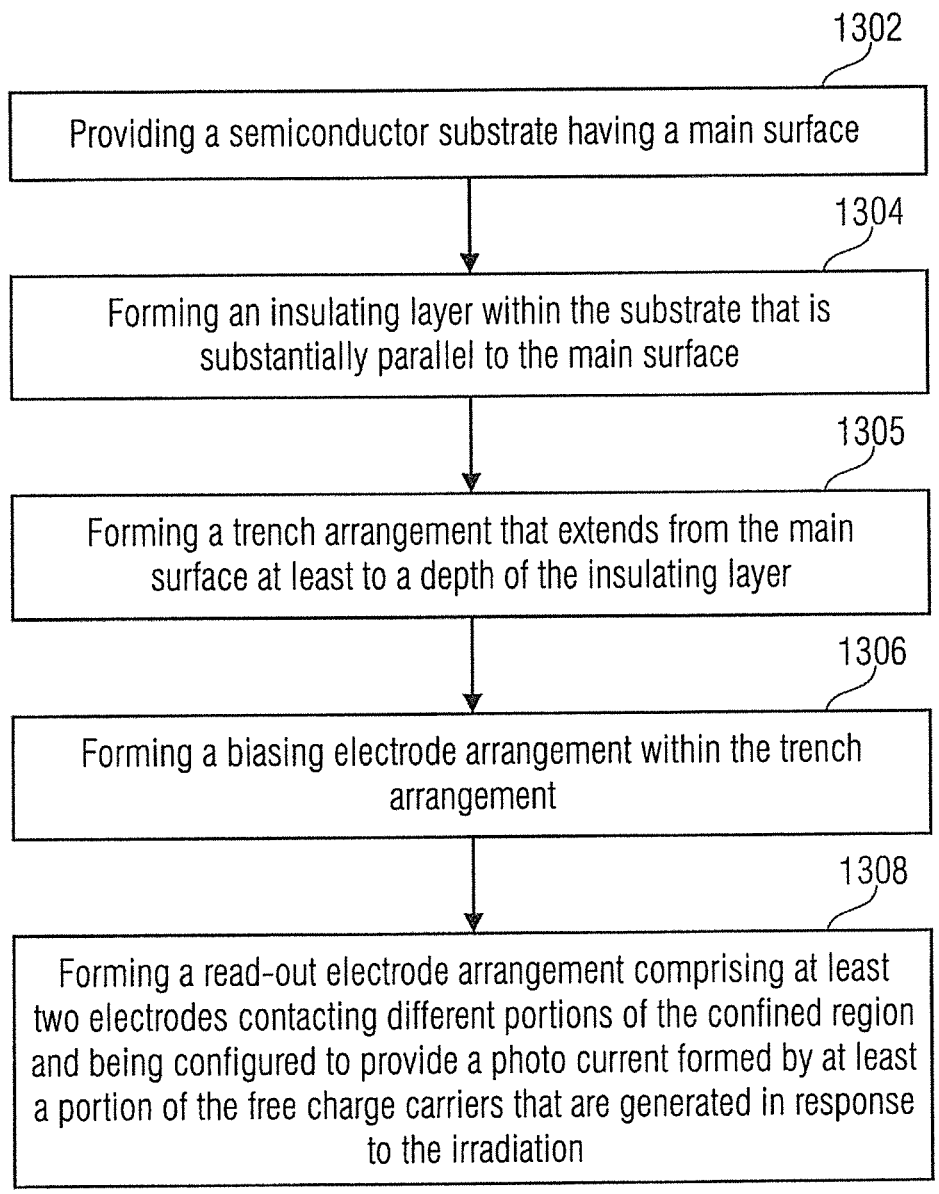
FIG. 13 shows a schematic flow diagram of a method for manufacturing a photodetector according to embodiments.

FIG. 13 shows a schematic flow diagram of a method for manufacturing a photodetector according to further embodiments. A semiconductor substrate having a main surface is provided at 1302. An insulating layer is then formed within the substrate at 1304. The insulating layer is substantially parallel to the main surface. Note that the insulating layer does not necessarily have to be formed throughout the entire substrate, but may be restricted to one or more regions or areas of the substrate. Furthermore, it is also possible that several insulating layers having different properties, such as different thicknesses or depths, are formed in the substrate. These options for forming one or more insulating layers are also applicable to the method schematically illustrated in the flow diagram of FIG. 12 and to the photodetectors described above.

At 1305 a trench arrangement is formed that extends from the main surface of the substrate at least to a depth of the insulating layer. The insulating layer and the trench arrangement will eventually form an insulating arrangement that electrically insulates a confined region of the substrate against the surrounding substrate and/or other surrounding structures.

The method schematically illustrated by the flow diagram of FIG. 13 further comprises forming a biasing electrode arrangement within the trench arrangement, as indicated at 1306. As an alternative, the biasing electrode arrangement may be formed not within, but adjacent to the trench arrangement. In some embodiments, the biasing electrode arrangement may further comprise a portion that is within the insulating layer or adjacent to the insulating layer at a side of the insulating layer opposite to the confined region. This portion of the biasing electrode arrangement may also be formed at 1306 or substantially concurrently with 1306. In some embodiments, previously formed cavities for the trenches and/or within the insulating layer may be filled with an electrically conductive material, e.g., polysilicon, at 1306.

At 1308 of the method for manufacturing a photodetector according to FIG. 13 a read-out electrode arrangement is formed. The read-out electrode arrangement comprises at least two electrodes contacting different portions of the confined region. The read-out electrode arrangement is configured to provide a photocurrent formed by at least a portion of free charge carriers that are generated in response to an irradiation incident on and absorbed within the confined region during an operation of the photodetector.

Figure 14:
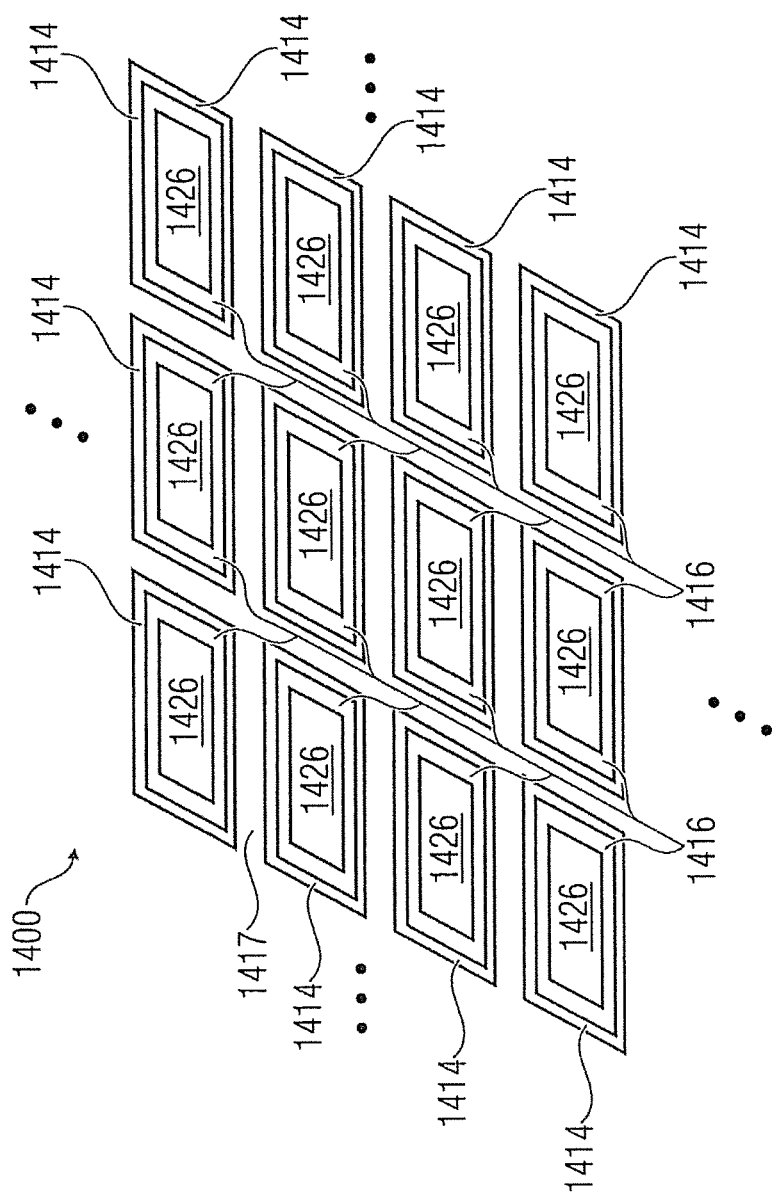
FIG. 14 shows a schematic, perspective view of an array of photodetectors according to embodiments.

FIG. 14 schematically shows a perspective top view of an array 1400 of a plurality of photodetectors according to embodiments. Each of the plurality of photodetectors comprises a confined region 1426 and insulating sidewalls 1416 laterally surrounding the corresponding confined region 1426. Furthermore, each of the plurality of photodetectors comprises a biasing electrode arrangement 1414 laterally surrounding the corresponding insulating sidewalls 1416 of the photodetector at hand. Not visible in FIG. 14 are insulating layers within the substrate that electrically insulate the confined regions 1426 towards the bottom. The biasing electrode arrangement 1414 of the individual photodetectors are electrically insulated against each other by an insulating grid 1417 that may be a part of the insulating arrangement. In the embodiment illustrated in FIG. 14 the array of photodetectors comprises twelve photodetectors. However, the array 1400 of photodetectors may comprise any other number of photodetectors.

Figure 15:
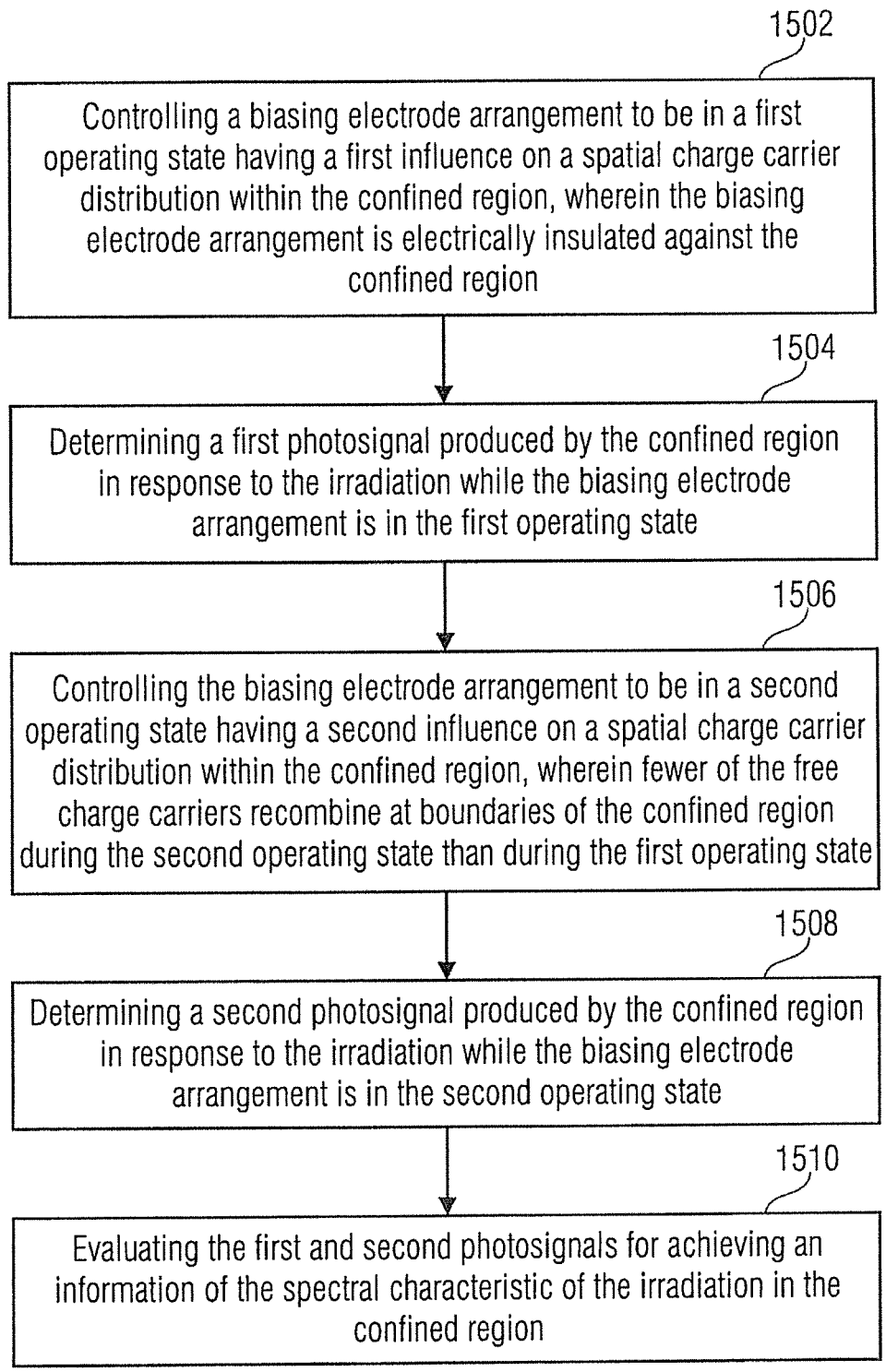
FIG. 15 shows a schematic flow diagram of a method for determining a spectral characteristic of an irradiation according to embodiments.

FIG. 15 shows a schematic flow diagram of a method for determining a spectral characteristic of an irradiation characteristic of an irradiation on a confined region of a semiconductor substrate. The confined region is configured to generate free charge carriers in response to an irradiation. The method comprises controlling a biasing electrode arrangement to be in a first operating state having a first influence on a spatial charge carrier distribution within the confined region at 1502, wherein the biasing electrode arrangement is electrically insulated against the confined region. The method also comprises determining a first photosignal produced by the confined region in response to the irradiation while the biasing electrode arrangement is in the first operating state at 1504. Furthermore, the method comprises controlling the biasing electrode arrangement to be in a second operating state having a second influence on a spatial charge carrier distribution within the confined region at 1506, wherein fewer of the free charge carriers recombine at boundaries of the confined region during the second operating state than during the first operating state. As indicated at 1508 of the method for determining a spectral characteristic of the irradiation according to the schematic flow diagram of FIG. 15, a second photosignal is determined that is produced by the confined region in response to the irradiation while the biasing electrode arrangement is in the second operating state.

The first and second photosignals are then evaluated at 1510 for achieving an information of the spectral characteristic of the irradiation in the confined region.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

In the foregoing detailed description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the detailed description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of other dependent claims or a combination of each feature with other dependent or independent claims. Such combinations are proposed herein unless it is stated that a specific combination is not intended. Furthermore, it is intended to also include features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such sub steps may be included and part of the disclosure of this single step unless explicitly excluded.

The invention claimed is:

1. A photodetector comprising:
    a substrate;
    an insulating arrangement formed in the substrate and electrically insulating a confined region of the substrate, the confined region being configured to generate free charge carriers in response to an irradiation;
    a read-out electrode arrangement comprising at least two electrodes contacting different portions of the confined region and being configured to provide a photocurrent formed by at least a portion of the free charge carriers that are generated in response to the irradiation; and
    a biasing electrode arrangement electrically insulated against the confined region by means of the insulating arrangement, the biasing electrode arrangement being configured to be electrically biased which causes an influence on a spatial charge carrier distribution within the confined region so that fewer of the free charge carriers recombine at boundaries of the confined region compared to an unbiased state.

2. The photodetector according to claim 1, wherein the insulating arrangement comprises an insulating layer within the substrate and substantially parallel to a main surface of the substrate and a trench arrangement extending from the main surface at least to a depth of the insulating layer.

3. The photodetector according to claim 2, wherein the insulating layer comprises a plurality of buried channels, each buried channel being delimited by an oxide material.

4. The photodetector according to claim 2, wherein at least a portion of the biasing electrode arrangement fills or lines an interior cavity of the trench.

5. The photodetector according to claim 1, wherein at least a portion of the biasing electrode arrangement is arranged within at least a portion of the insulating arrangement.

6. The photodetector according to claim 1, wherein the confined region and at least a portion of the insulating arrangement form a silicon-on-insulator structure.

7. The photodetector according to claim 1, wherein the confined region has one of a box shape, a prism shape, a hexagonal prism shape, and a cylinder shape.

8. The photodetector according to claim 1, wherein the biasing electrode arrangement is adjacent to the insulating arrangement in a lateral direction extending parallel to a main surface of the substrate.

9. The photodetector according to claim 1, wherein the biasing electrode arrangement encloses the insulating arrangement in a lateral direction extending parallel to a main surface of the substrate and is open with respect to a bottom boundary and a top boundary of the confined region.

10. The photodetector according to claim 1, wherein the biasing electrode arrangement encloses the insulating arrangement in a lateral direction extending parallel to a main surface of the substrate and at a bottom boundary of the insulating arrangement.

11. The photodetector according to claim 1, wherein the biasing electrode arrangement comprises at least two biasing electrode portions that are electrically insulated against each other and configured to be controlled independently from each other to thereby provide a further degree of freedom for influencing the spatial charge carrier distribution.

12. The photodetector according to claim 1, wherein the photodetector is a spectrometer and wherein varying the spatial charge carrier distribution within the confined region by means of the biasing electrode arrangement alters a spectral response of the photodetector.

13. The photodetector according to claim 1, wherein the confined region is one of a plurality of confined regions insulated against each other by the insulating arrangement, each confined region corresponding to a pixel of a pixel array.

14. A photodetector comprising
a substrate;
an insulating layer within the substrate and substantially parallel to a main surface of the substrate;
a trench arrangement comprising at least one trench that extends from the main surface at least to a depth of the insulating layer so that the trench arrangement and the insulating layer delimit a confined region of the substrate configured to generate free charge carriers in response to an irradiation;
a read-out electrode arrangement comprising at least two electrodes contacting different portions of the confined region for conducting a photocurrent associated with at least a portion of the free charge carriers generated in response to the irradiation; and
a biasing electrode arrangement formed within the trench arrangement, the biasing electrode arrangement being configured to be electrically biased and to thereby produce a surface charge at an interface between the confined region and the trench arrangement, the surface charge reducing a recombination activity at the interface.

15. The photodetector according to claim 14, wherein the insulating layer comprises a plurality of buried channels, each buried channel being delimited by an oxide material.

16. The photodetector according to claim 14, wherein the biasing electrode arrangement further comprises a biasing electrode portion that is arranged within or adjacent to the insulating layer at a side that is opposite to the confined region.

17. The photodetector according to claim 14, wherein the confined region and the insulating layer form a silicon-on-insulator structure.

18. The photodetector according to claim 14, wherein the confined region has one of a box shape, a prism shape, a hexagonal prism shape, and a cylinder shape.

19. The photodetector according to claim 14, wherein the biasing electrode arrangement encloses the insulating arrangement in a lateral direction extending parallel to a main surface of the substrate and is open with respect to a bottom boundary and a top boundary of the confined region.

20. The photodetector according to claim 14, wherein the biasing electrode arrangement encloses the insulating arrangement in a lateral direction extending parallel to a main surface of the substrate and at a bottom boundary of the insulating arrangement.

21. A photodetector comprising:
a substrate;
means for electrically insulating a confined region of the substrate, the confined region being configured to generate free charge carriers in response to an irradiation;
means for providing a photocurrent as an output of the photodetector, the photocurrent being formed by at least a portion of the free charge carriers that are generated in response to the irradiation; and
means for influencing a spatial charge carrier distribution within the confined region so that in a biased state of the means for influencing fewer of the free charge carriers recombine at boundaries of the confined region compared to an unbiased state, the means for influencing being formed within the substrate and insulated against the confined region by means of the means for electrically insulating the confined region.

* * * * *